(12) United States Patent
Hook et al.

(10) Patent No.: US 9,786,546 B1
(45) Date of Patent: Oct. 10, 2017

(54) BULK TO SILICON ON INSULATOR DEVICE

(71) Applicant: INTERNATIONAL BUSINESS MACHINES CORPORATION, Armonk, NY (US)

(72) Inventors: Terence B. Hook, Jericho, VT (US); Joshua M. Rubin, Albany, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/091,866

(22) Filed: Apr. 6, 2016

(51) Int. Cl.
| | |
|---|---|
| *H01L 21/8234* | (2006.01) |
| *H01L 21/762* | (2006.01) |
| *H01L 29/06* | (2006.01) |
| *H01L 29/66* | (2006.01) |
| *H01L 29/78* | (2006.01) |
| *H01L 29/08* | (2006.01) |

(52) U.S. Cl.
CPC .. *H01L 21/76256* (2013.01); *H01L 21/76283* (2013.01); *H01L 29/0684* (2013.01); *H01L 29/0847* (2013.01); *H01L 29/66795* (2013.01); *H01L 29/785* (2013.01)

(58) Field of Classification Search
CPC ........... H01L 21/76283; H01L 29/0684; H01L 29/0847; H01L 29/66795; H01L 29/785; H01L 27/1266; H01L 31/1892; H01L 21/823431; H01L 21/823821; H01L 21/845; H01L 27/0924; H01L 27/10826; H01L 27/10879; H01L 27/1211; H01L 29/41791; H01L 21/76254; H01L 21/76259
See application file for complete search history.

(56) References Cited

U.S. PATENT DOCUMENTS

| | | | |
|---|---|---|---|
| 7,829,989 B2 | 11/2010 | Sun et al. | |
| 8,294,211 B2 | 10/2012 | Yang et al. | |

(Continued)

OTHER PUBLICATIONS

List of IBM Patents or Patent Applications Treated as Related; (Appendix P), Filed Apr. 6, 2016, 2 pages.

(Continued)

*Primary Examiner* — Jarrett Stark
*Assistant Examiner* — Bitew Dinke
(74) *Attorney, Agent, or Firm* — Cantor Colburn LLP; Vazken Alexanian

(57) ABSTRACT

A method for forming a semiconductor device comprises forming a fin in a bulk semiconductor substrate and depositing a first insulator layer over portions of the bulk semiconductor substrate adjacent to the fin. The method further includes removing portions of the first insulator layer to reduce a thickness of the first insulator layer and expose a sidewall of the fin. An etch stop layer is deposited on the first insulator layer. A gate stack is formed over a channel region of the fin and over portions of the etch stop layer. A portion of the bulk semiconductor substrate is removed to expose portions of the etch stop layer and the fin, and a second insulator layer is deposited over exposed portions of the fin and the etch stop layer.

18 Claims, 34 Drawing Sheets

(56) References Cited

U.S. PATENT DOCUMENTS

| | | | |
|---|---|---|---|
| 8,816,428 B1* | 8/2014 | Miller | H01L 21/762 257/329 |
| 8,872,274 B2 | 10/2014 | Cohen et al. | |
| 9,196,810 B2 | 11/2015 | Odnoblyudov et al. | |
| 9,209,305 B1 | 12/2015 | Zhang et al. | |
| 9,214,398 B2 | 12/2015 | Lee | |
| 9,230,861 B2 | 1/2016 | Chetlur et al. | |
| 9,496,260 B1* | 11/2016 | Balakrishnan | H01L 27/0886 |
| 2006/0157706 A1* | 7/2006 | Zhu | H01L 21/76254 257/66 |
| 2007/0054465 A1* | 3/2007 | Currie | H01L 21/76254 438/455 |
| 2007/0296002 A1* | 12/2007 | Liang | H01L 21/84 257/288 |
| 2008/0206977 A1 | 8/2008 | Frank et al. | |
| 2009/0011562 A1* | 1/2009 | Licitra | H01L 29/458 438/283 |
| 2009/0224295 A1* | 9/2009 | Coronel | H01L 21/76816 257/288 |
| 2011/0169084 A1* | 7/2011 | Yang | H01L 21/84 257/347 |
| 2013/0175659 A1* | 7/2013 | Liu | H01L 29/66795 257/506 |
| 2013/0302950 A1* | 11/2013 | Doris | H01L 29/66477 438/151 |
| 2014/0061820 A1* | 3/2014 | Reznicek | H01L 21/823821 257/401 |
| 2014/0377917 A1* | 12/2014 | He | H01L 27/0886 438/157 |
| 2015/0129891 A1* | 5/2015 | Lin | H01L 29/2003 257/77 |
| 2015/0279725 A1* | 10/2015 | Waldron | H01L 21/76251 257/506 |
| 2015/0332966 A1 | 11/2015 | Maling et al. | |
| 2015/0357477 A1 | 12/2015 | Zhang et al. | |
| 2016/0005821 A1 | 1/2016 | Kim et al. | |
| 2016/0276345 A1* | 9/2016 | Yu | H01L 27/0886 |
| 2016/0322392 A1* | 11/2016 | Mochizuki | H01L 29/0657 |

OTHER PUBLICATIONS

Terence B. Hook et al., "Bulk to Silicon on Insulator Device", U.S. Appl. No. 15/364,573, filed Nov. 30, 2016.
Terence B. Hook et al., "Bulk to Silicon on Insulator Device", U.S. Appl. No. 15/364,578, filed Nov. 30, 2016.
List of IBM Patents or Patent Applications Treated as Related; (Appendix P), Filed Jun. 1, 2016, 2 pages.
Terence B. Hook, et al., "Bulk to Silicon on Insulator Device", U.S. Appl. No. 15/135,756, filed Apr. 22, 2016.

* cited by examiner

BULK TO SILICON ON INSULATOR DEVICE

BACKGROUND

The present invention generally relates to complimentary metal-oxide semiconductors (CMOS) and metal-oxide-semiconductor field-effect transistors (MOSFET), and more specifically, to forming semiconductor devices using a bulk semiconductor substrate with backside contacts.

The MOSFET is a transistor used for switching electronic signals. The MOSFET has a source, a drain and a gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device comprises forming a fin in a bulk semiconductor substrate and depositing a first insulator layer over portions of the bulk semiconductor substrate adjacent to the fin. The method further includes removing portions of the first insulator layer to reduce a thickness of the first insulator layer and expose a sidewall of the fin. An etch stop layer is deposited on the first insulator layer. A gate stack is formed over a channel region of the fin and over portions of the etch stop layer. A portion of the bulk semiconductor substrate is removed to expose portions of the etch stop layer and the fin, and a second insulator layer is deposited over exposed portions of the fin and the etch stop layer.

According to another embodiment of the present invention, a method for forming a semiconductor device comprises depositing a first insulator layer on a bulk semiconductor substrate, depositing an etch stop layer on the first insulator layer, and depositing a second insulator layer on the etch stop layer. A portion of the second insulator layer, the etch stop layer, and the first insulator layer is removed to form a cavity that exposes a portion of the bulk semiconductor substrate. A semiconductor fin is grown in the cavity. The second insulator layer is removed to expose the etch stop layer and sidewalls of the fin. A gate stack is formed over a channel region of the fin and over portions of the etch stop layer. Portions of the bulk semiconductor substrate are removed to expose portions of the etch stop layer and the fin, and a third insulator layer is deposited over exposed portions of the fin and the etch stop layer.

According to yet another embodiment of the present invention, a semiconductor device comprises an insulator layer and a semiconductor fin arranged on the insulator layer. An etch stop layer is arranged on the insulator layer adjacent to the semiconductor fin, and a gate stack is arranged over a channel region of the semiconductor fin and the etch stop layer.

According to yet another embodiment of the present invention, a method for forming a semiconductor device comprises forming a semiconductor fin on a substrate and a gate stack over a channel region of the semiconductor fin. A bonding film is deposited over the gate stack and the semiconductor fin and a handle wafer is bonded to the bonding film. A portion of an insulator layer of the substrate is removed to expose a portion of the semiconductor fin and a semiconductor material is grown on exposed portions of the semiconductor fin.

According to yet another embodiment of the present invention, a method for forming a semiconductor device comprises forming a semiconductor fin on an insulator layer of a substrate and forming a gate stack over a channel region of the semiconductor fin. A portion of the insulator layer is removed to expose an underlying substrate layer. A source/drain region is grown adjacent to the gate stack. The underlying substrate layer is removed to expose a portion of the source/drain region, and a back-side source/drain region is grown from exposed portions of the source/drain region.

According to yet another embodiment of the present invention, a semiconductor device comprises a semiconductor channel region arranged on an insulator layer and a gate stack arranged on the semiconductor channel region. A crystalline semiconductor source/drain region is arranged adjacent to the channel region, and a back-side crystalline semiconductor source/drain region extends from the crystalline source/drain region.

BRIEF DESCRIPTION OF THE DRAWINGS

FIG. 1 illustrates a side view of a bulk semiconductor substrate and a hardmask layer arranged on the semiconductor substrate.

FIG. 2 illustrates a side view following the formation of fins in the semiconductor substrate.

FIG. 3 illustrates a side view following the deposition of a shallow trench isolation (STI) region over exposed portions of the semiconductor substrate and adjacent to the fins.

FIG. 4 illustrates a side view following the removal of portions of the STI region to expose portion of the fins.

FIG. 5 illustrates a side view following the formation of an etch stop layer over exposed portions of the STI region.

FIG. 6 illustrates a top view of the fins arranged on the semiconductor substrate (of FIG. 5) with the etch stop layer arranged over the STI region.

FIG. 7 illustrates a side view of the bulk semiconductor substrate that is similar to the semiconductor substrate described above.

FIG. 8 illustrates a side view following the formation of an etch stop layer over exposed portions of the first insulator layer.

FIG. 9 illustrates a side view following the formation of a second insulator layer over exposed portions of the etch stop layer.

FIG. 10 illustrates a side view following the patterning and removal of portions of the second insulator layer, the etch stop layer and the first insulator layer to expose portions of the semiconductor substrate and form cavities.

FIG. 11 illustrates a side view following the formation of epitaxially grown fins that substantially fill the cavities (of FIG. 10).

FIG. 12 illustrates a side view following a selective etching process that removes exposed portions of the second insulator layer (of FIG. 11) and exposes the etch stop layer and portions of the fins.

FIG. 13 illustrates a top view of the fins arranged on the semiconductor substrate (of FIG. 12) and the etch stop layer arranged around the fins on the first insulator layer (of FIG. 12).

FIGS. 14-18 illustrate an exemplary method for forming gate stacks and source/drain regions over the fins (of FIG. 6).

FIG. 14 illustrates a side view following the formation of a sacrificial gate over channel regions of the fins.

FIG. 15 illustrates a top view following the formation of spacers adjacent to the sacrificial gates.

FIG. 16 illustrates a side view following the formation of source/drain regions.

FIG. 17 illustrates a top view of following the deposition of an inter-level dielectric layer over the source/drain regions (of FIG. 16).

FIG. 24 illustrates a side view of a structure similar to the structure shown in FIG. 22 that was fabricated using a similar method as described above in FIGS. 1-22.

FIG. 25 illustrates a side view following the formation of contacts in the cavity.

FIG. 26 illustrates a top view of a structure that is similar to the structure shown in FIG. 18A.

FIG. 27 illustrates a top view following a patterning and etching process that removes exposed portions of the inter-level dielectric layer and exposes portions of the source/drain region (of FIG. 16).

FIG. 28 illustrates a cut-away view along the line A-A (of FIG. 27) that shows the conductive contacts arranged over the source/drain region.

FIG. 29 illustrates a side view following the formation of a bonding film and the bonding of the handle wafer to the bonding film in a similar manner as described above.

FIG. 30 illustrates a side view following a grinding and planarization process that exposes portions of the fins and the etch stop layer using a similar process as described above in FIG. 21.

FIG. 31 illustrates a side view following the formation of an insulator layer using a similar process as described above in FIG. 22.

FIG. 32 illustrates a side view of the resultant structure following the removal of the handle wafer and the bonding film (of FIG. 31).

FIG. 35 illustrates a finFET arrangement similar to the device shown in FIG. 22.

FIG. 36 illustrates a cut-away view through a fin a perpendicular to the gate stacks.

FIG. 37 illustrates a cut-away view following the removal of exposed portions of the insulator layer to expose portions of the underlying fins.

FIG. 38 illustrates a cut-away view following the removal of the mask (of FIG. 37) and an epitaxial growth process that forms extended source/drain regions FIG. 39 illustrates a cut-away view following the formation of an insulator layer over the source/drain regions.

FIG. 40 illustrates a cut-away view following a lithographic patterning and etching process that removes portions of the insulator layer and exposes the source/drain regions.

FIG. 41 illustrates a cutaway view of a finFET device 4001 arranged on an SOI wafer 4002.

FIG. 42 illustrates a cut-away view following a selective etching process that removes portions of the insulator layer 4004 and portions of the fin 4006 to expose the underlying substrate 4002.

FIG. 43 illustrates a cut-away view following an epitaxial growth process that forms a source/drain region 4302.

DETAILED DESCRIPTION

Semiconductor devices such as multi-gate field effect transistors (FETs) offer advantages over planar FET devices. Multi-gate FETs are formed on a substrate and have a three dimensional profile that provides greater channel area for a given area of a substrate than planar FETs. The finFET is an example of a multi-gate FET that includes fins arranged on a substrate. The fins usually have three surfaces in the channel regions with gates arranged over the surfaces of the channel region.

Fins may be formed on a bulk semiconductor substrate by etching to remove semiconductor materials from the substrate to form fins. Fins may alternatively be formed on a semiconductor on insulator (SOI) substrate, where portions of the semiconductor material are removed to form fins on the insulator layer. In some fabrication methods, the use of a bulk substrate has advantages over using an SOI substrate. In particular, bulk semiconductor substrates tend to be less expensive, and the processing steps for forming devices on bulk semiconductor substrates offer some advantages in efficiency and cost.

As device geometries continue to decrease, forming conductive contacts to electrically connect the source/drain and gate terminals to other devices is more challenging because the area for forming the contacts is more limited. The embodiments described herein provide methods for forming a resultant structure with contacts formed on the backside of the substrate, where the semiconductor devices are substantially formed on the front side of the substrate.

Previous methods for forming backside contacts typically formed semiconductor devices on a SOI substrate. The embodiments described herein provide methods for forming semiconductor devices using a bulk substrate where the resultant structure resembles a semiconductor device formed on an SOI substrate, which offers advantages when forming backside contacts. More specifically, the embodiments described herein provide design space and transistor structures to reduce the detrimental impact that scaling (i.e., reduced dimensions/geometries) can have on device capacitance (e.g., parasitic capacitance) and the device source/drain contact resistance. According to one or more embodiments, contacts are mirrored to the backside of the device for bulk CMOS. By finishing the device up to contact formation, flipping and bonding the device, thinning the wafer backside up to the shallow trench isolation (STI), thinning further to remove a punch through stopper or strained-relaxed buffer, depositing a backside dielectric to make an SOI-like device and making contacts for the source/drain/gate through the backside, reduction in capacitance (e.g., parasitic capacitance) can be achieved and additional room for the contacts can also be obtained, thereby providing the opportunity to improve source drain contact resistance.

FIGS. 1-6 illustrate an exemplary method for forming fins on a bulk substrate.

Figure 1:
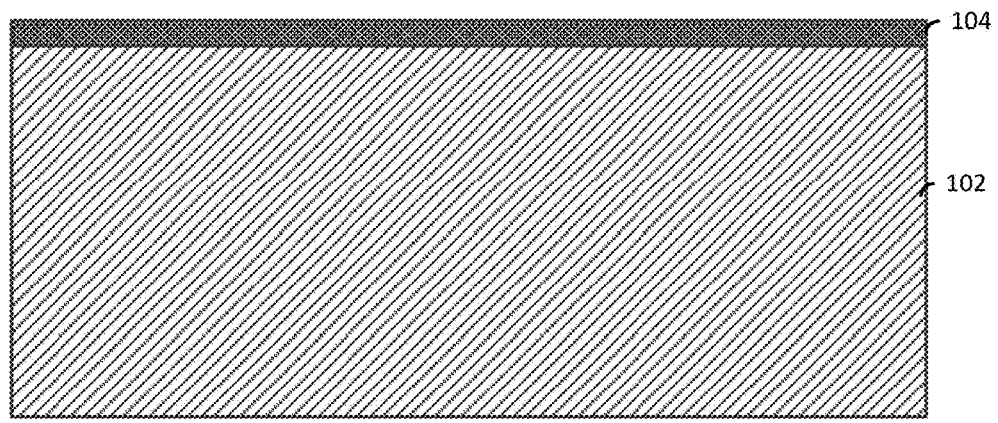
FIGS. 1-6 illustrate an exemplary method for forming fins on a bulk substrate.

FIG. 1 illustrates a side view of a bulk semiconductor substrate 102 and a hardmask layer 104 arranged on the semiconductor substrate 102.

The substrate 102 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). The semiconductor substrate 102 may also comprise an organic semiconductor or a layered semiconductor such as, for example, Si/SiGe, a silicon-on-insulator or a SiGe-on-insulator. A portion or entire semiconductor substrate 102 may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate 102 may be doped, undoped or contain doped regions and undoped regions therein. The semiconductor substrate may contain regions with strain and regions without strain therein, or contain regions of tensile strain and compressive strain.

A hardmask layer 104 is arranged on the semiconductor substrate 102. The hardmask layer 104 may include, for example, silicon oxide, silicon nitride (SiN), SiOCN, SiBCN or any suitable combination of those. The hardmask layer 104 may be deposited using a deposition process, including, but not limited to, PVD, CVD, PECVD, or any combination thereof.

Figure 2:
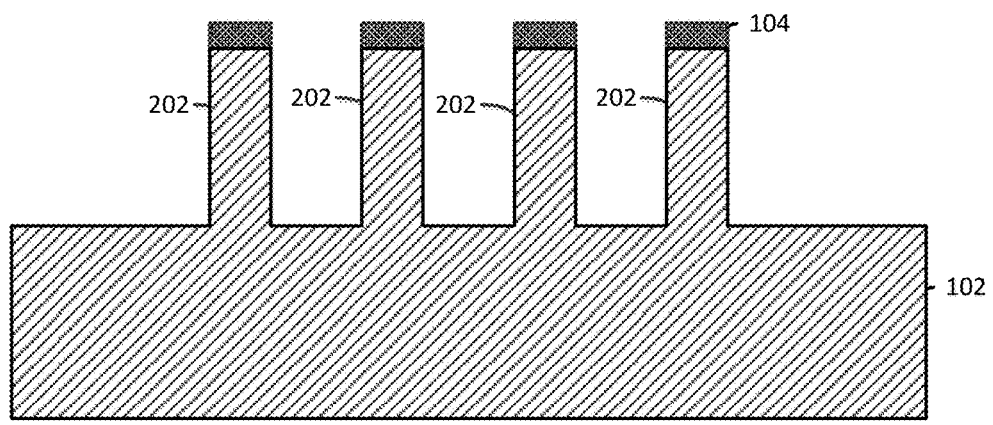

FIG. 2 illustrates a side view following the formation of fins 202 in the semiconductor substrate 102. The fins 202 may be patterned by, for example, a lithographic patterning and etching process such as, reactive ion etching (RIE) or a sidewall imaging transfer process that removes exposed portions of the hardmask layer 104 and portions of the semiconductor substrate 102 to form the fins 202.

Figure 3:
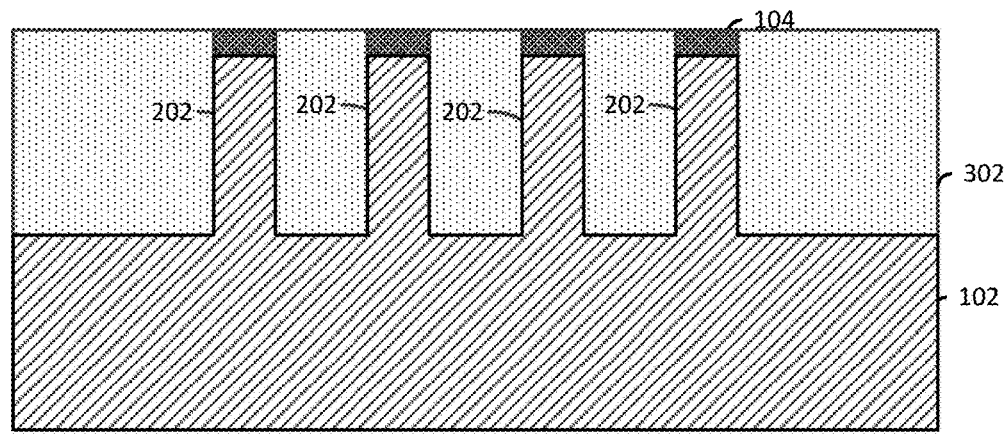

FIG. 3 illustrates a side view following the deposition of a shallow trench isolation (STI) region 302 over exposed portions of the semiconductor substrate 102 and adjacent to the fins 202. The STI region 302 may be formed by, any suitable process including, for example, filling the trenches partially defined by the fins 202 with an insulating material, such an oxide material. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

In the illustrated embodiment, at least one isolation region is a shallow trench isolation region ("STI"). However, the isolation region 302 may be a trench isolation region, a field oxide isolation region (not shown), or any other type of isolation region. The isolation region 302 provides isolation between neighboring gate structure regions, and may be used when the neighboring gates have opposite conductivities, e.g., nFETs and pFETs. As such, the isolation region 302 separates an nFET device region from a pFET device region.

Figure 4:
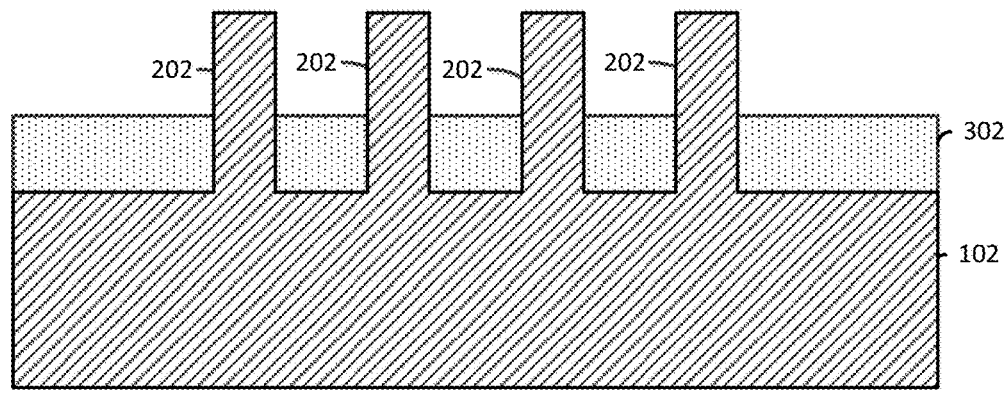

FIG. 4 illustrates a side view following the removal of portions of the STI region 302 to expose portion of the fins 202. The portions of the STI region 302 may be removed by, for example, a selective chemical etching process.

Figure 5:
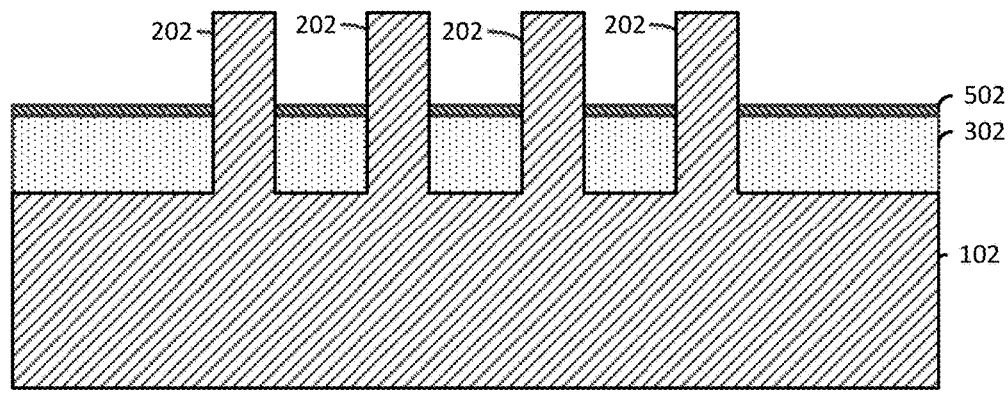

FIG. 5 illustrates a side view following the formation of an etch stop layer 502 over exposed portions of the STI region 302. The etch stop layer 502 in the illustrated embodiment includes a nitride material such as, for example, silicon nitride or silicon dioxide. The etch stop layer 502 may be deposited by, for example, a high density plasma deposition and etch process or a physical vapor deposition process. Though the etch stop layer 502 is not shown deposited on top surfaces of the fins 202 in the illustrated embodiment, in alternate embodiments the portions of the etch stop layer 502 may be arranged on the fins 202.

Figure 6:
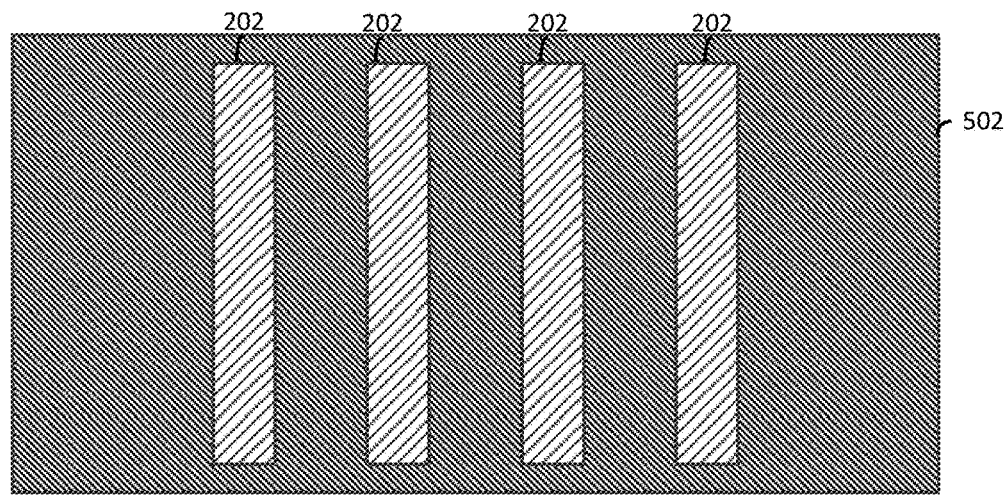

FIG. 6 illustrates a top view of the fins 202 arranged on the semiconductor substrate 102 (of FIG. 5) with the etch stop layer 502 arranged over the STI region 302 (of FIG. 5).

FIGS. 7-13 illustrate another exemplary method for forming fins on a bulk semiconductor substrate.

Figure 7:
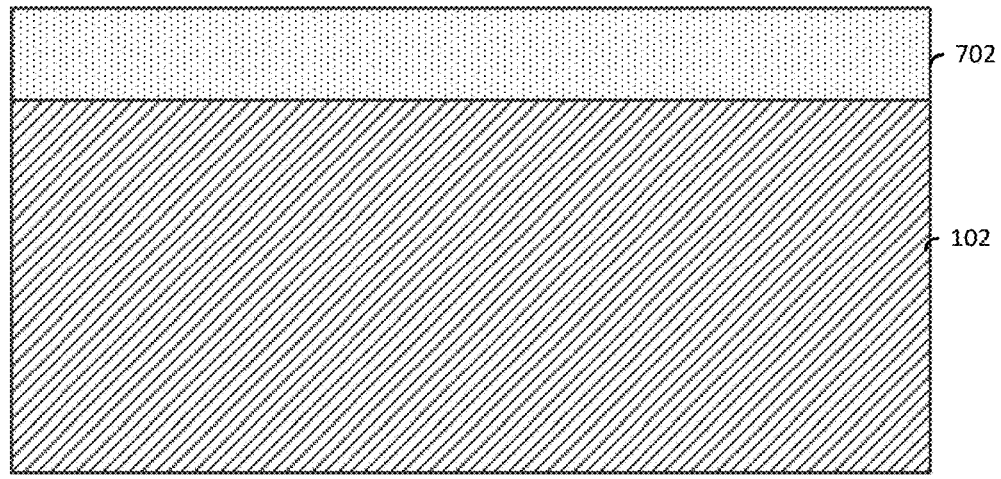
FIGS. 7-13 illustrate another exemplary method for forming fins on a bulk semiconductor substrate.

FIG. 7 illustrates a side view of the bulk semiconductor substrate 102 that is similar to the semiconductor substrate 102 described above. In the illustrated exemplary embodiment, a first insulator layer 702 is arranged on the semiconductor substrate 102. The first insulator layer 702 includes an insulating material such as, for example, an oxide material.

Figure 8:
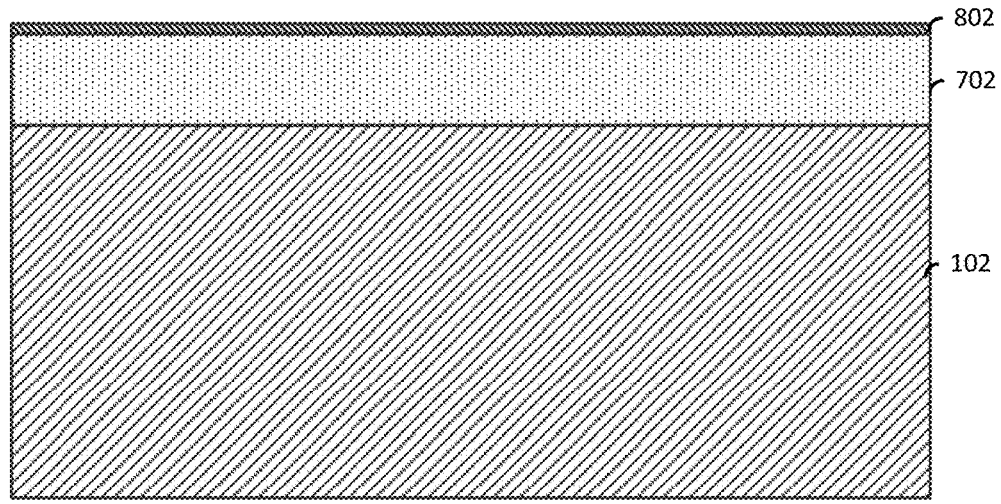

FIG. 8 illustrates a side view following the formation of an etch stop layer 802 over exposed portions of the first insulator layer 702. The etch stop layer 802 may include for example, a nitride material such as, silicon nitride. The etch stop layer 802 is deposited by a suitable deposition process, for example, chemical vapor deposition (CVD) or physical vapor deposition (PVD). Though the illustrated embodiment includes the etch stop layer 802 arranged on the first insulator layer 702, alternate exemplary embodiments may include the etch stop layer 802 arranged on the substrate 102 and the first insulator layer 702 arranged on the etch stop layer 802.

Figure 9:
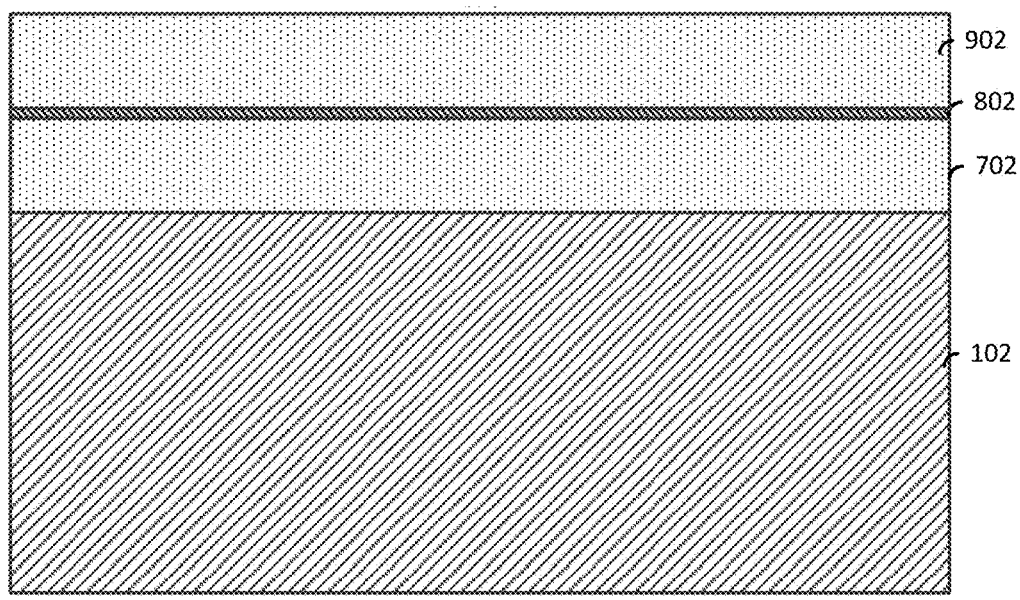

FIG. 9 illustrates a side view following the formation of a second insulator layer 902 over exposed portions of the etch stop layer 802. The second insulator layer 902 is similar to the first insulator layer 702 and may include, for example, an oxide material.

Figure 10:
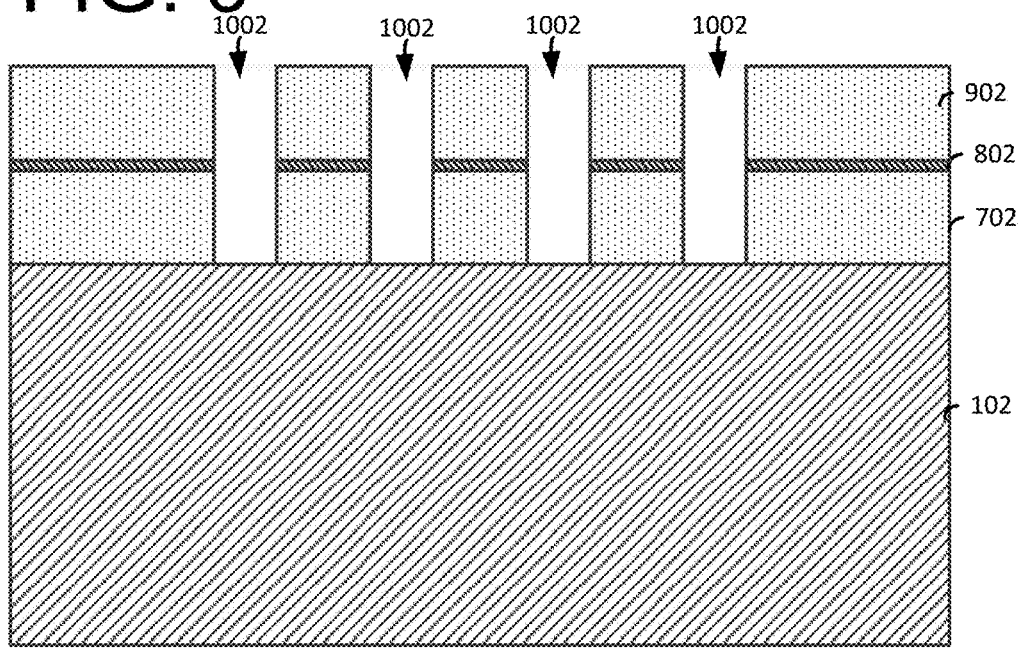

FIG. 10 illustrates a side view following the patterning and removal of portions of the second insulator layer 902, the etch stop layer 802 and the first insulator layer 702 to expose portions of the semiconductor substrate 102 and form cavities 1002. The cavities 1002 may be formed by, for example, a lithographic patterning and etching process such as reactive ion etching. The cavities 1002 are defined by the semiconductor substrate 102, the first insulator layer 702, the etch stop layer 802, and the second insulator layer 902.

Figure 11:
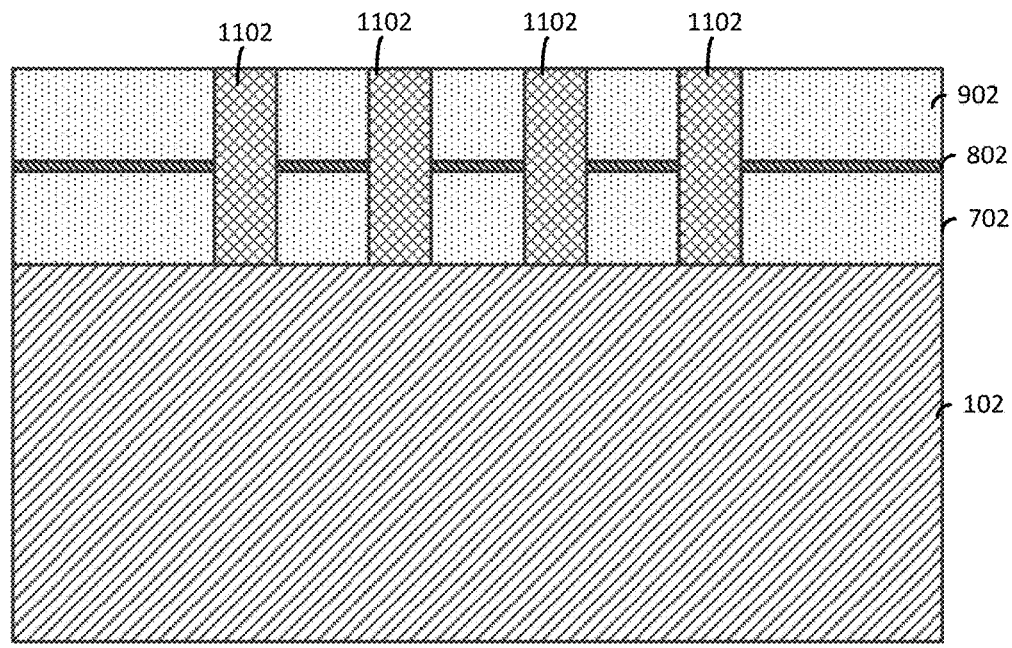

FIG. 11 illustrates a side view following the formation of epitaxially grown fins 1102 that substantially fill the cavities 1002 (of FIG. 10). Epitaxial materials may be grown from gaseous or liquid precursors. Epitaxial materials may be grown using ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), molecular beam epitaxy (MBE), vapor-phase epitaxy (VPE), molecular-beam epitaxy (MBE), liquid-phase epitaxy (LPE), or other suitable process, or other suitable processes.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Following the growth of the fins 1102, a planarization process such as, for example, chemical mechanical polishing may be performed to remove overburdened portions of the epitaxial material to form the fins 1102.

Figure 12:
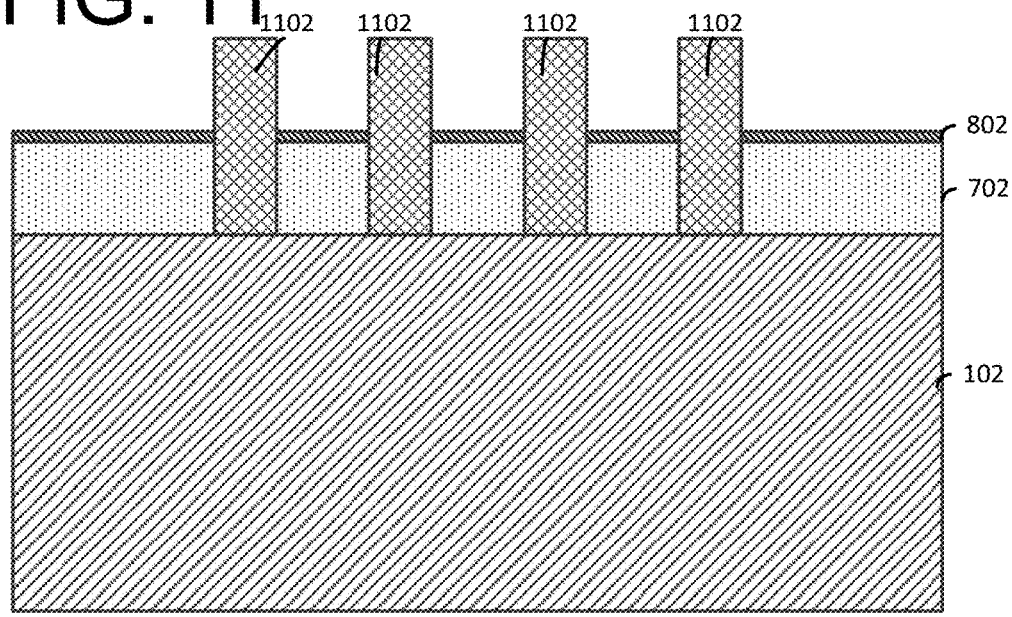

FIG. 12 illustrates a side view following a selective etching process that removes exposed portions of the second insulator layer 902 (of FIG. 11) and exposes the etch stop layer 802 and portions of the fins 1102. The etching process may include, for example, a selective etching process that removes the exposed second insulator layer 902 material without substantially removing material from the fins 1102 or the etch stop layer 802.

Figure 13:
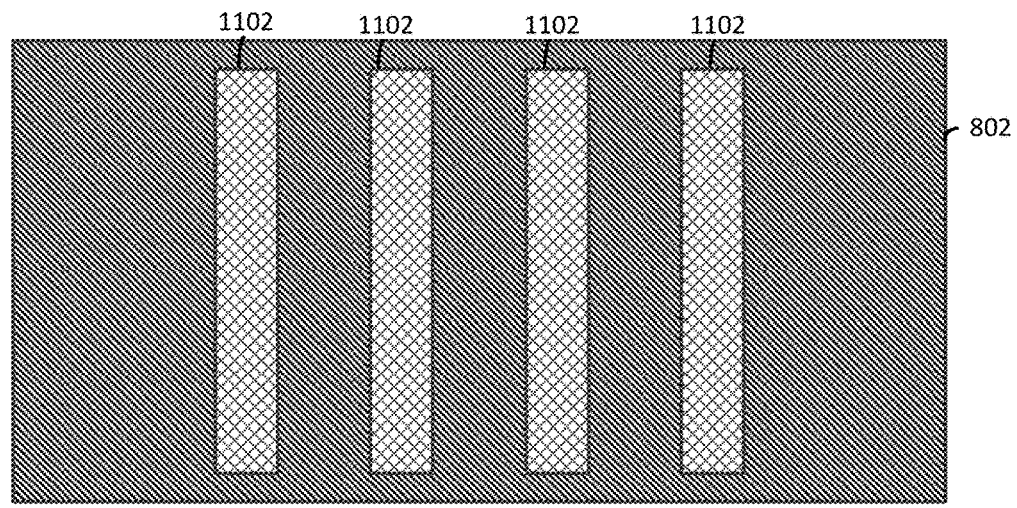

FIG. 13 illustrates a top view of the fins 1102 arranged on the semiconductor substrate 102 (of FIG. 12) and the etch stop layer 802 arranged around the fins 1102 on the first insulator layer 702 (of FIG. 12).

FIGS. 14-18 illustrate an exemplary method for forming gate stacks and source/drain regions over the fins 202 (of FIG. 6). For illustrative purposes, FIGS. 14-18 show the formation of gate stacks over the fins 202. However, in alternate exemplary embodiments, the gate stacks and source/drain regions shown in FIGS. 14-18 may be formed in a similar manner over the fins 1102 (of FIG. 13).

Figure 14:
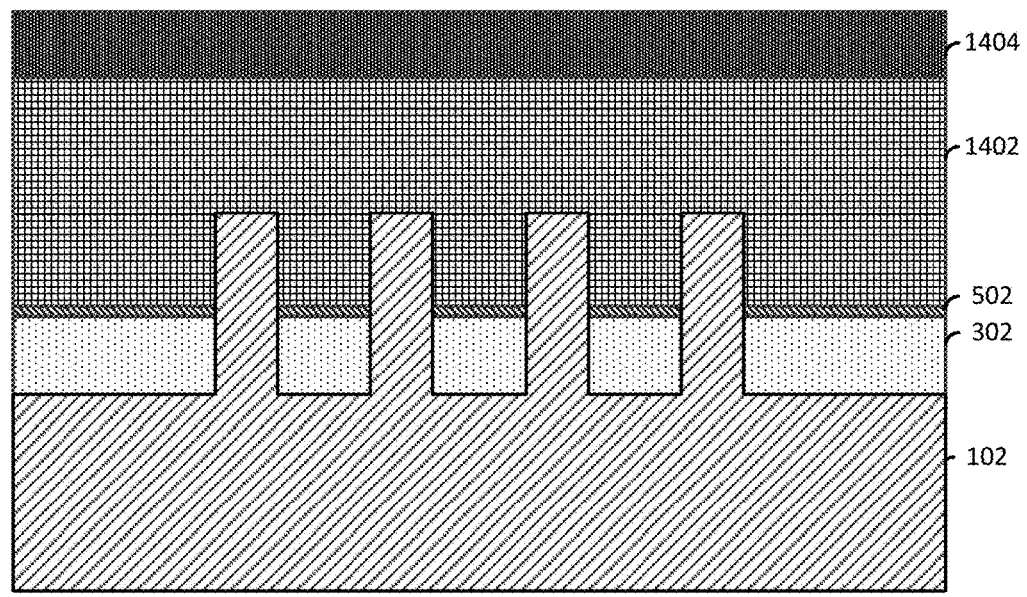

FIG. 14 illustrates a side view following the formation of a sacrificial gate 1402 over channel regions of the fins 202. The sacrificial gates 1402 in the exemplary embodiment are formed by depositing a layer (not shown) of sacrificial gate material such as, for example, amorphous silicon (aSi), or polycrystalline silicon (polysilicon) material or another suitable sacrificial gate material.

The layer sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 1404. The hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gates 1402 and the sacrificial gate caps 1404.

Figure 15:
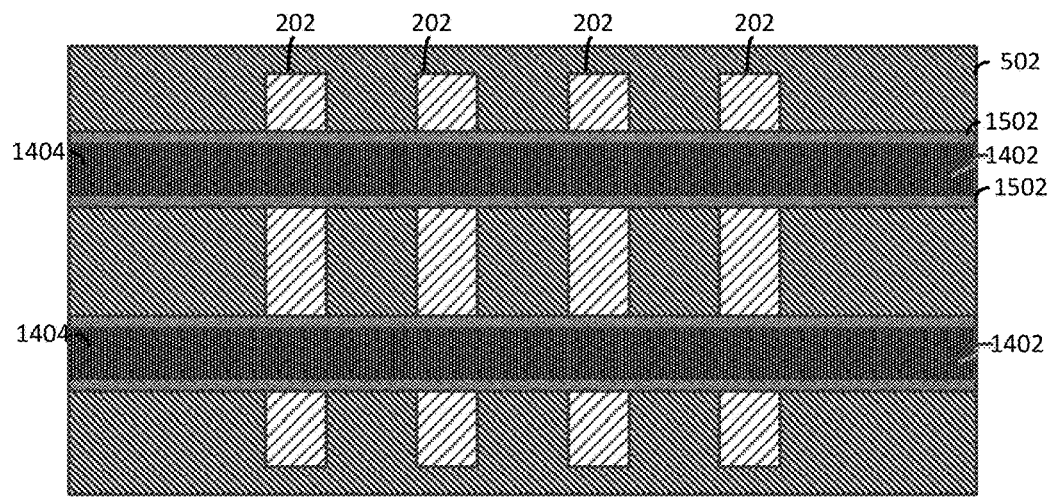

FIG. 15 illustrates a top view following the formation of spacers 1502 adjacent to the sacrificial gates 1402. The spacers 1502 in the illustrated embodiment are formed by depositing a layer of spacer material (not shown) over the exposed portions of the etch stop layer 502, the fins 202, and the sacrificial gates 1402. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 1502.

Figure 16:
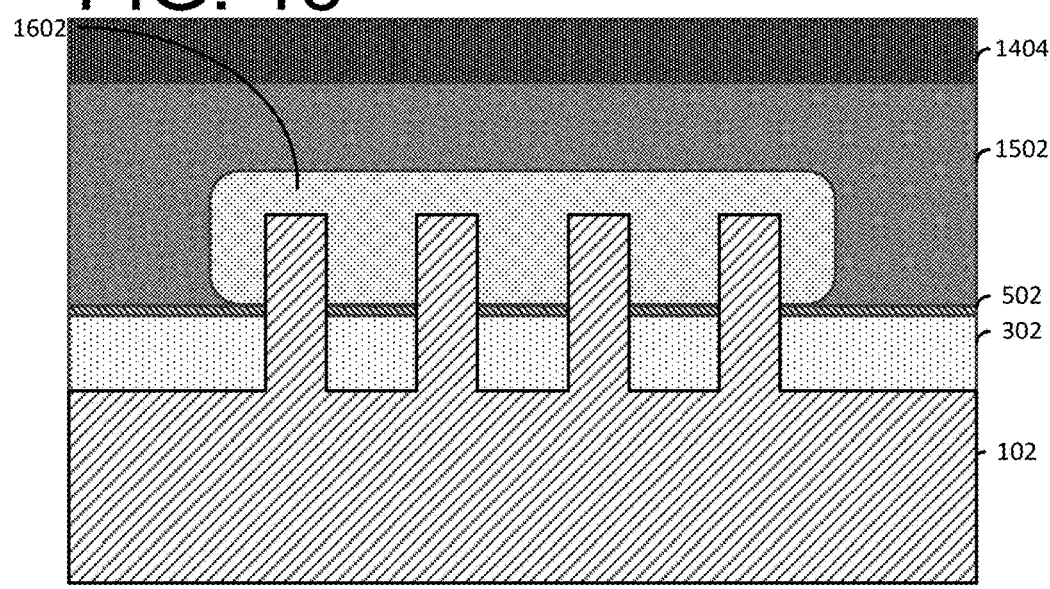

FIG. 16 illustrates a side view following the formation of source/drain regions 1602. The source/drain regions 1602 are formed by an epitaxial growth process that deposits a crystalline overlayer of semiconductor material onto the exposed crystalline seed material of the exposed fin 202 to form the source/drain regions 1602.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-31}$, or preferably between $2 \times 10^{20}$ cm$^{-3}$ to $1 \times 10^{21}$ cm$^{-3}$.

Though the illustrated embodiment shows the formation of epitaxially grown source/drain regions 1602, alternate exemplary embodiments may form source drain regions in the fins 202 by, for example, performing an ion implantation process that implants dopants into the fins 202 to form source/drain regions.

Figure 17:
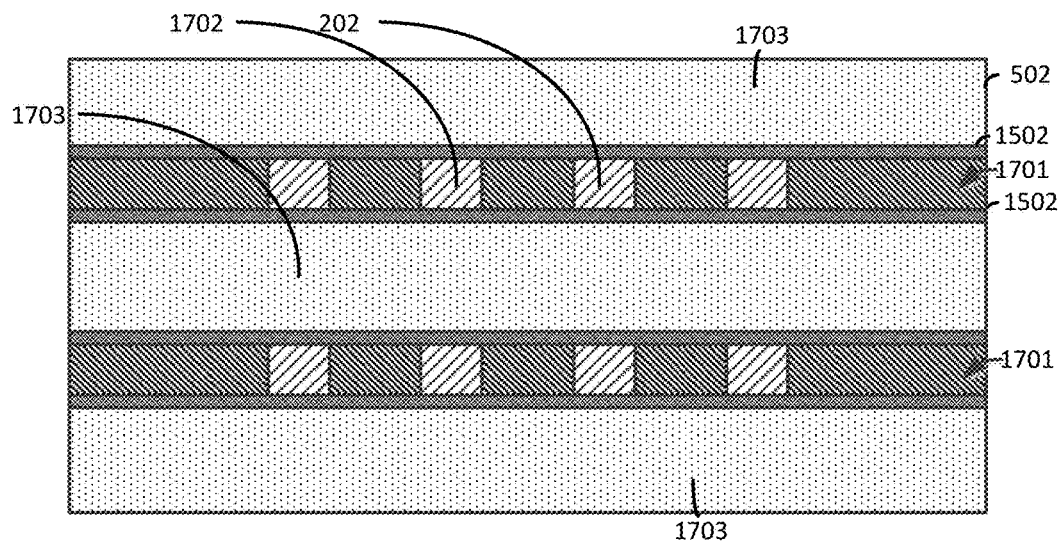

FIG. 17 illustrates a top view of following the deposition of an inter-level dielectric layer 1703 over the source/drain regions 1602 (of FIG. 16), and the removal of the sacrificial gates 1402 (of FIG. 15). The sacrificial gates 1402 are removed following the deposition of the inter-level dielectric layer 1703. The removal of the sacrificial gates 1402 exposes the channel regions 1702 of the fins 202 that forms cavities 1701. The inter-level dielectric layer 1703 is formed from, for example, a low-k dielectric material (with k<4.0), including but not limited to, silicon oxide, spin-on-glass, a flowable oxide, a high density plasma oxide, borophospho-silicate glass (BPSG), or any combination thereof. The inter-level dielectric layer 1703 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1703, a planarization process such as, for example, chemical mechanical polishing is performed.

The sacrificial gates 1402 may be removed by performing a dry etch process, for example, RIE, followed by a wet etch process. The wet etch process is selective to (will not substantially etch) the spacers 1502 and the inter-level dielectric material. The chemical etch process may include, but is not limited to, hot ammonia or tetramethylammonium hydroxide (TMAH).

Figure 18A:
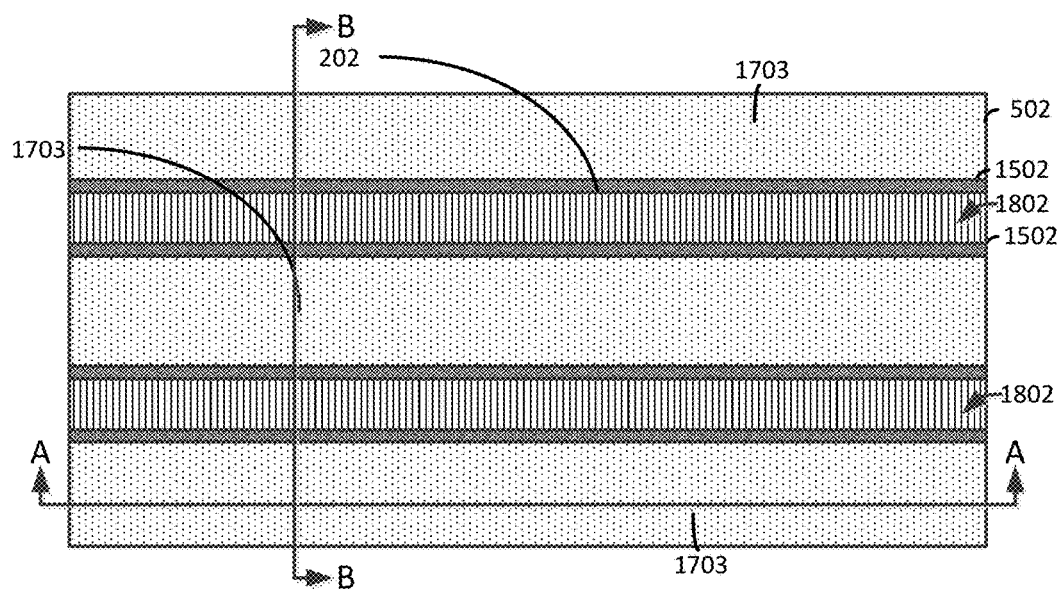
FIG. 18A illustrates a top view and FIG. 18B illustrates a cut-away view along the line B-B (of FIG. 18A) following the formation of replacement metal gates (gate stacks) in the cavities (of FIG. 17).
Figure 18B:
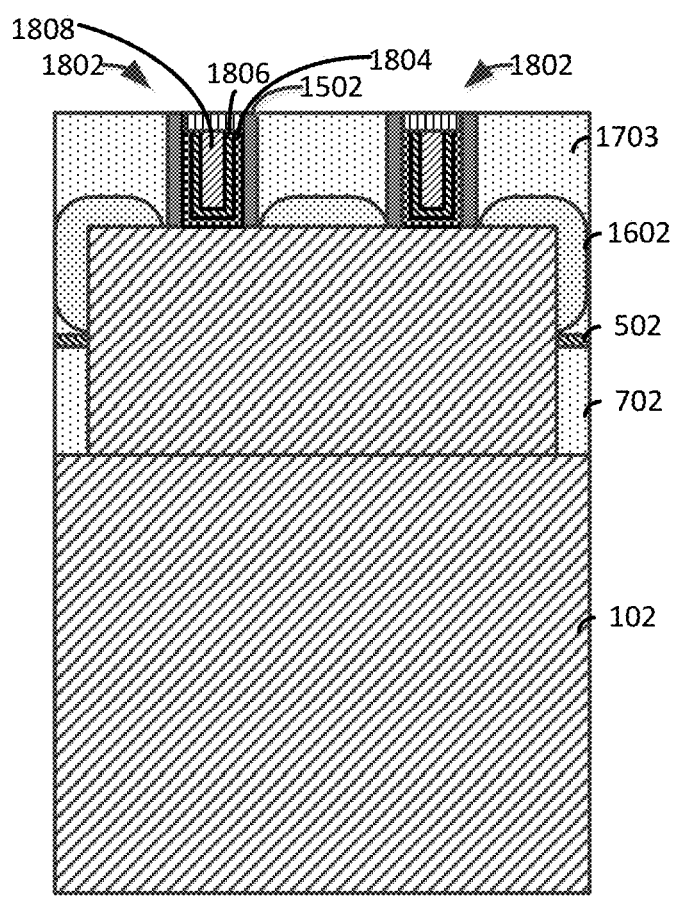

FIG. 18A illustrates a top view and FIG. 18B illustrates a cut-away view along the line B-B (of FIG. 18A) following the formation of replacement metal gates (gate stacks) 1802 in the cavities 1701 (of FIG. 17). The gate stack 1802 include high-k metal gates formed, for example, by filling the cavity 1701 (of FIG. 17) with one or more gate dielectric 1804 materials, one or more workfunction metals 1806, and one or more metal gate conductor 1808 materials. The gate dielectric 1804 material(s) can be a dielectric material having a dielectric constant greater than 3.9, 7.0, or 10.0. Non-limiting examples of suitable materials for the dielectric 1804 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 1804 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1806 may be disposed over the gate dielectric 1804 material. The type of work function metal(s) 1806 depends on the type of transistor and may differ between the nFET and pFET devices. Non-limiting examples of suitable work function metals 1806 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 1808 material(s) is deposited over the gate dielectric 1804 materials and work function metal(s) 1806 to form the gate stack 1802. Non-limiting examples of suitable conductive metals include aluminum (Al), platinum (Pt), gold (Au), tungsten (W), titanium (Ti), or any combination thereof. The gate conductor 1808 material(s) may be deposited by a suitable deposition process, for example, CVD, PECVD, PVD, plating, thermal or e-beam evaporation, and sputtering.

Following the deposition of the gate dielectric 1804 materials, the work function metal(s) 1806, and the gate conductor 1808 material(s), planarization process, for example, chemical mechanical planarization (CMP), is performed to remove the overburden of the deposited gate materials and form the gate stack 1802.

Figure 19:
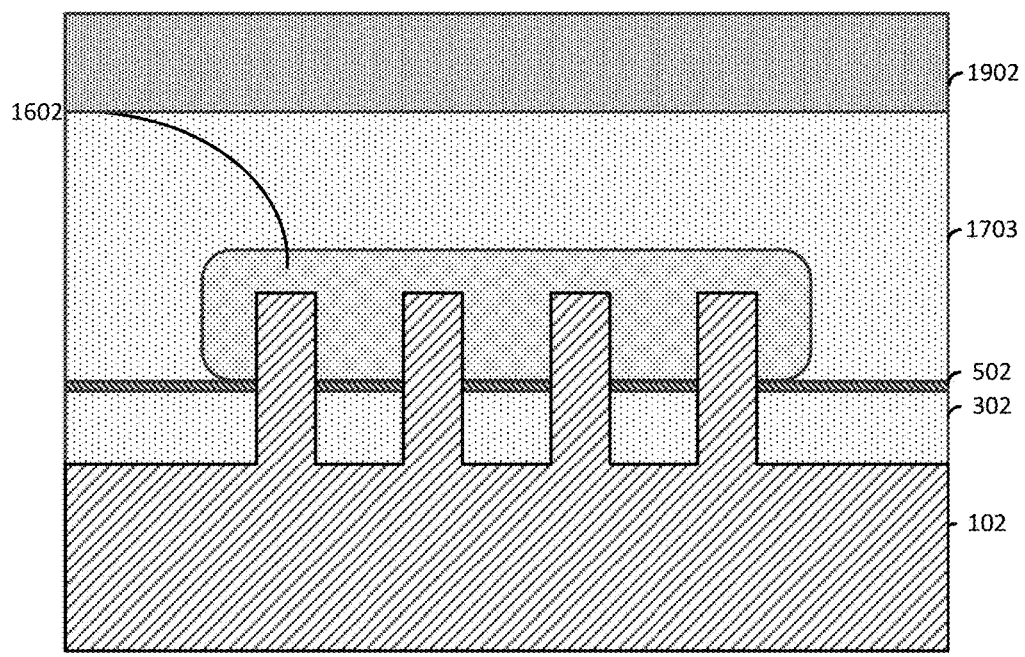
FIG. 19 illustrates a cut-away view along the line B-B (of FIG. 18A) following the deposition of a bonding film over the inter-level dielectric layer.

FIG. 19 illustrates a cut-away view along the line A-A (of FIG. 18A) following the deposition of a bonding film 1902 over the inter-level dielectric layer 1703. The bonding film 1902 may include, for example, $SiO_2$, $Si_3N_4$, low temperature oxide (LTO), tetraethyl orthosilicate (TEOS), polymers, spin-on dielectric material. Following the deposition of the bonding film 1902, a planarizing process may be performed followed by a surface activation process, which is dependent on the type of bonding film 1902 used.

Figure 20:
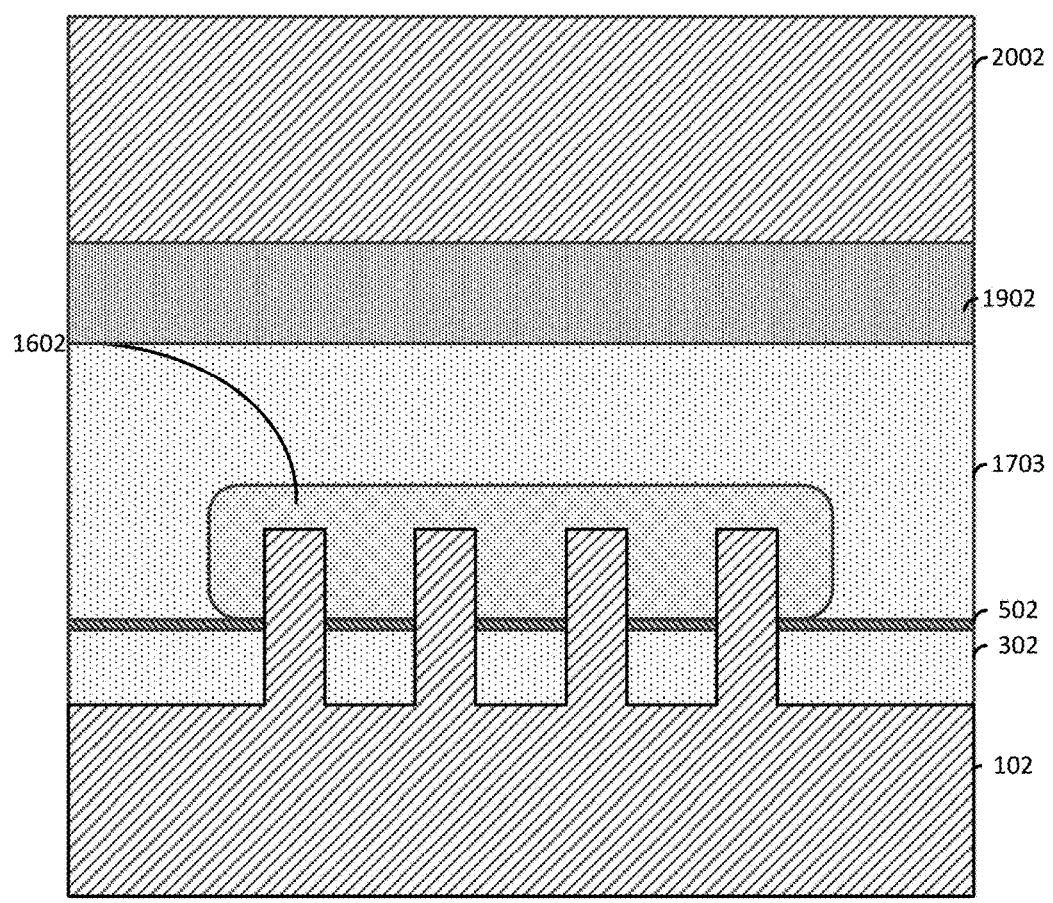
FIG. 20 illustrates a side view following the bonding of a bulk semiconductor handle wafer to the bonding film.

FIG. 20 illustrates a side view following the bonding of a bulk semiconductor handle wafer 2002 to the bonding film 1902.

Figure 21:
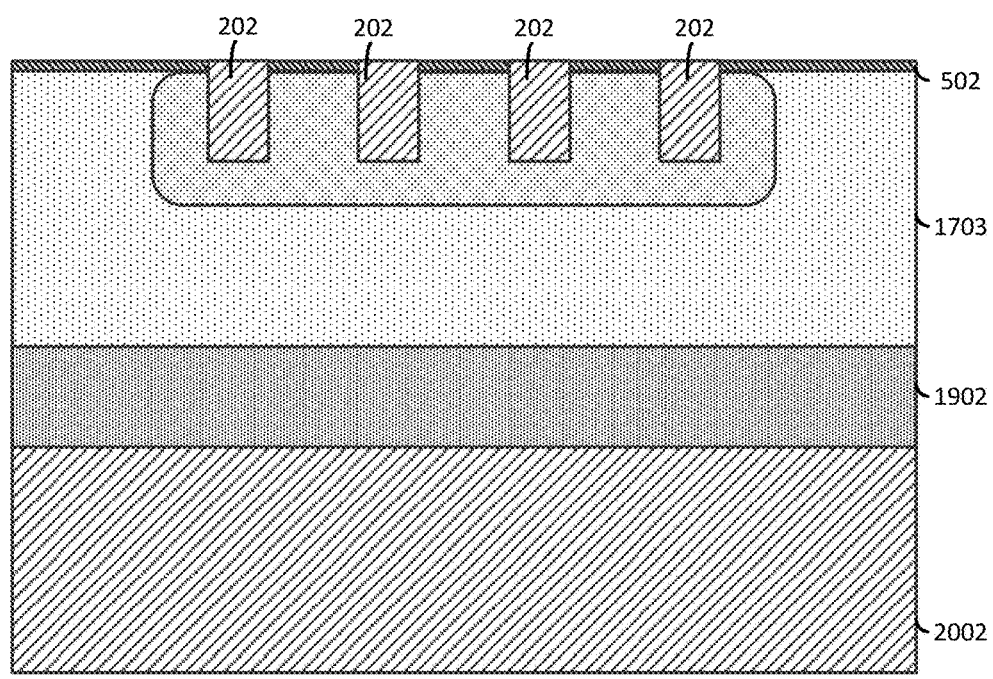
FIG. 21 illustrates a side view following a grinding and chemical mechanical polishing process that removes exposed portions of the bulk substrate (of FIG. 20).

FIG. 21 illustrates a side view following a grinding and chemical mechanical polishing process that removes exposed portions of the bulk substrate 102 (of FIG. 20). In this regard, in the illustrated exemplary embodiment, the assembly is rotated or flipped 180 degrees after the handle wafer 2002 has been attached to the bonding film 1902. An etching process such as reactive ion etching, a chemical process, or a grinding process may be used to efficiently remove exposed portions of the bulk substrate 102 to substantially reduce the thickness of the bulk substrate 102. Following the grinding process, a planarization process such as, for example, a chemical mechanical polishing process planarizes exposed portions of the bulk substrate 102 and stops when the etch stop layer 502 is exposed. Thus, the etch stop layer 502 provides a precise stopping point for the planarization process. The resultant structure includes exposed portions of the fins 202 and the etch stop layer 502.

Figure 22:
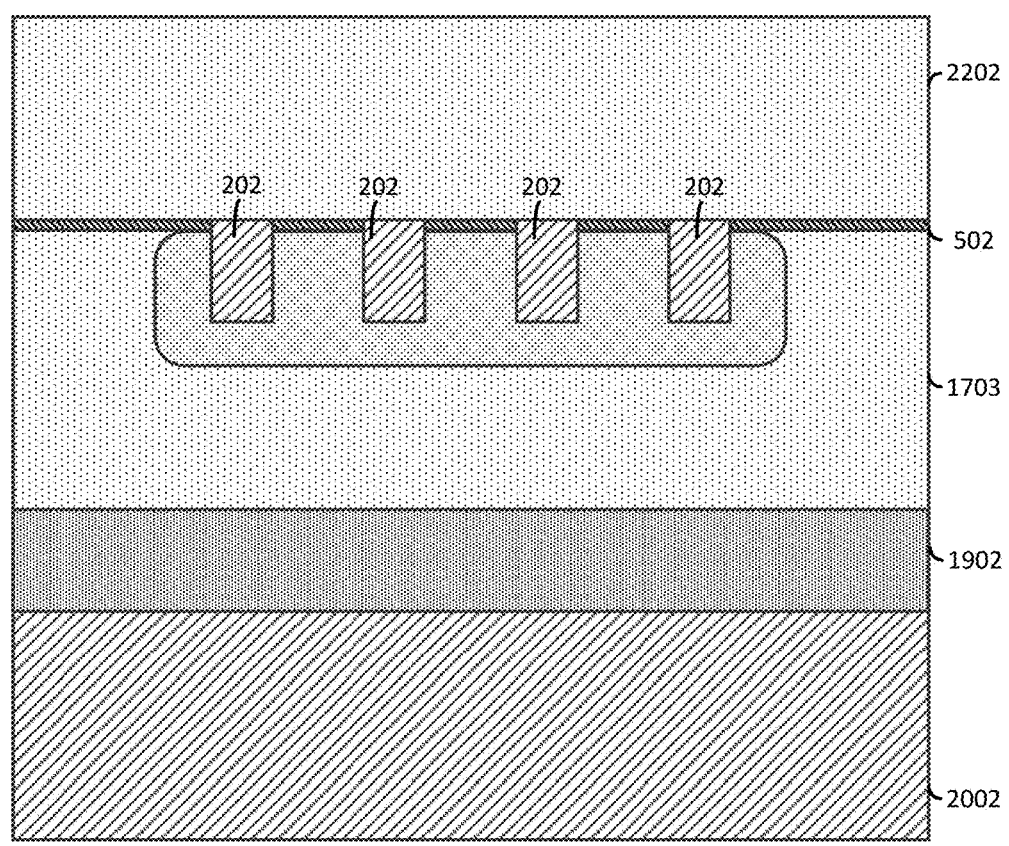
FIG. 22 illustrates a side view following the deposition of an insulating layer over the exposed portions of the fins and the etch stop layer.

FIG. 22 illustrates a side view following the deposition of an insulating layer 2202 over the exposed portions of the fins 202 and the etch stop layer 502. The insulator layer 2202 may include, for example, a buried oxide (BOX) material or other suitable insulator materials. Examples of suitable insulator materials include silicon oxide, silicon nitride, silicon oxynitride, boron nitride, or any combination of these materials.

The thickness of insulator layer 2202 generally varies and is not intended to be limited. In one aspect, the thickness of the insulator layer 2202 is in a range from about 10 nm to about 1000 nm. The insulator layer 2202 can be formed by any suitable process such thermal nitridation or chemical vapor deposition (CVD).

Figure 23:
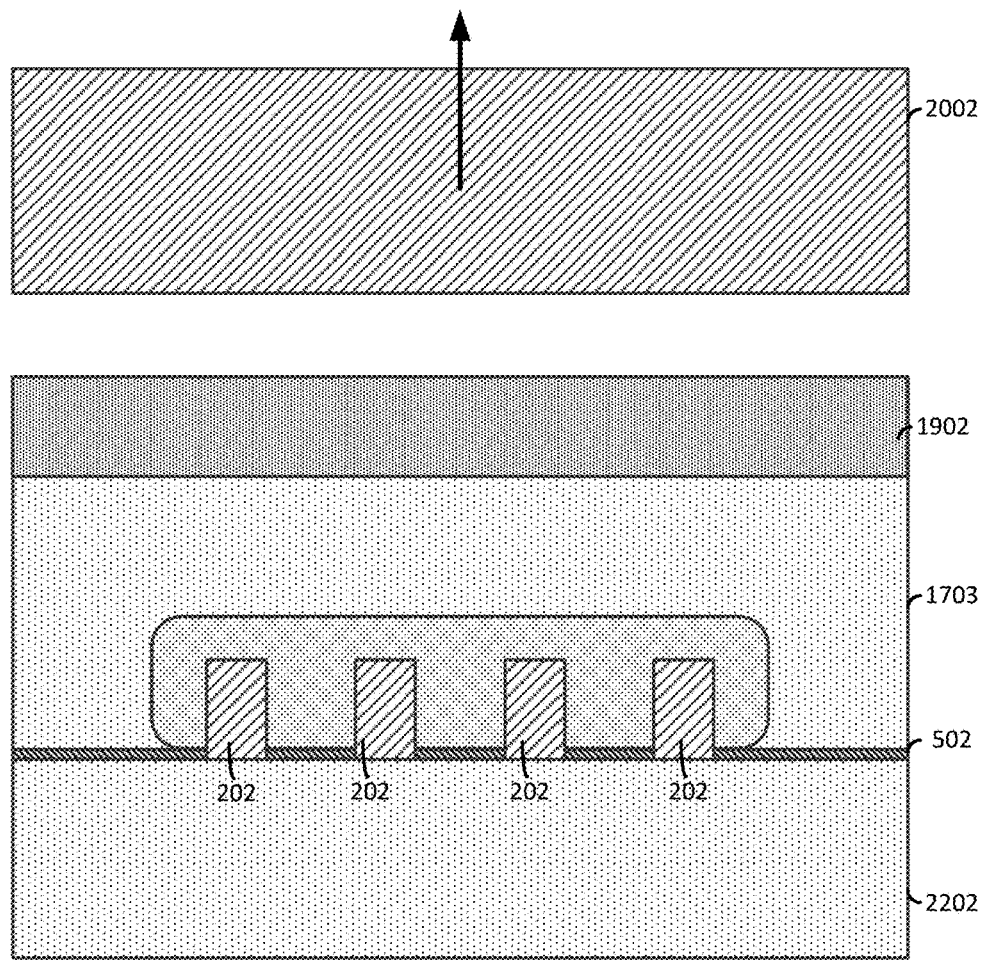
FIG. 23 illustrates a side view following the removal of the handle wafer from the bonding film.

FIG. 23 illustrates a side view following the removal of the handle wafer 2002 from the bonding film 1902. The handle wafer 2002 may be removed by, for example, using a mechanical force to separate the handle wafer 2002 from the bonding film 1902. A second handle wafer (not shown) may be bonded to the insulator layer 2202 prior to removing the handle wafer 2002.

The resultant structure includes a finFET device that is arranged on an insulator layer 2202 and an etch stop layer 502. The resultant structure was formed from a bulk semiconductor substrate that was subsequently substantially removed from the resultant structure during the fabrication process.

After the handle wafer 2002 is removed, the bonding film 1902 may be removed and/or additional insulating material (not shown) may be deposited over the device(s). The inter-level dielectric material 1703 may be patterned to form cavities (not shown) that expose portions of the source/drain region 1602 and the gate stacks 1802 (of FIGS. 18A and 18B). The cavities may be filled by a conductive material (not shown) and, in some embodiments, a liner layer (not shown) to form conductive contacts (not shown).

Figure 24:
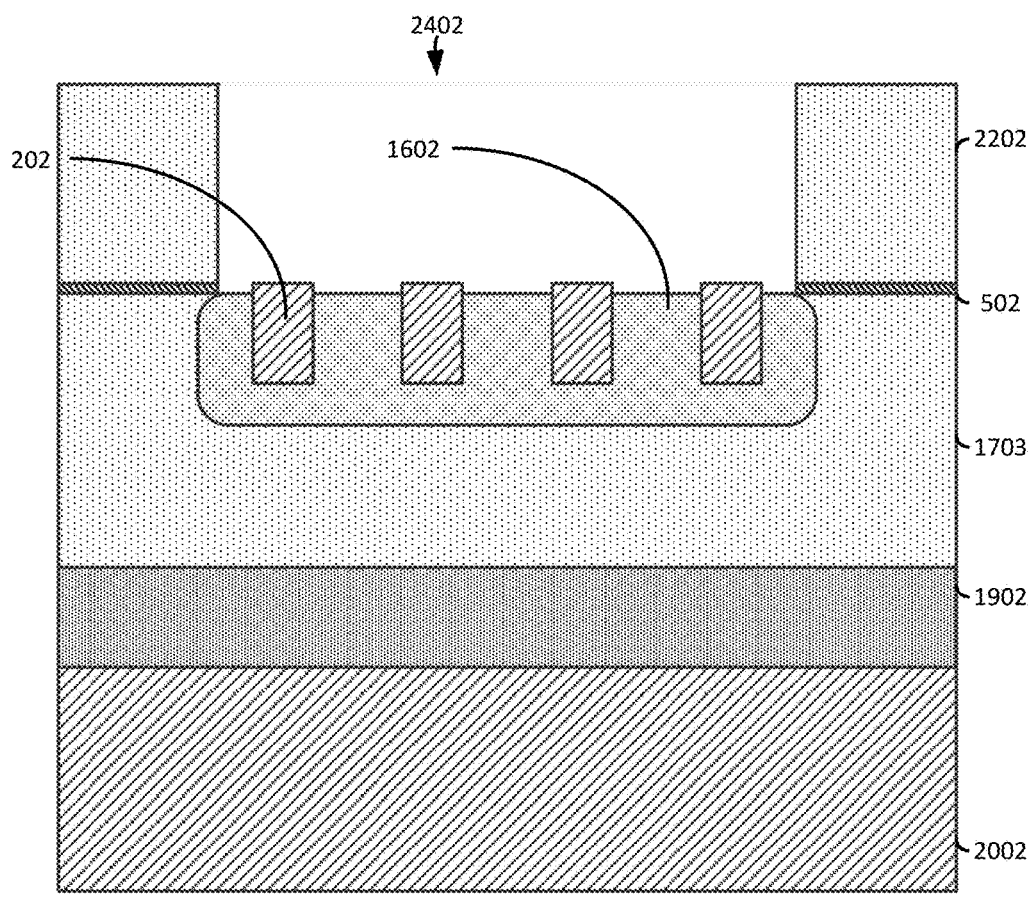
FIGS. 24-25 illustrate an alternate exemplary method for forming a finFET device that includes forming contacts over the etch stop layer.
Figure 25:
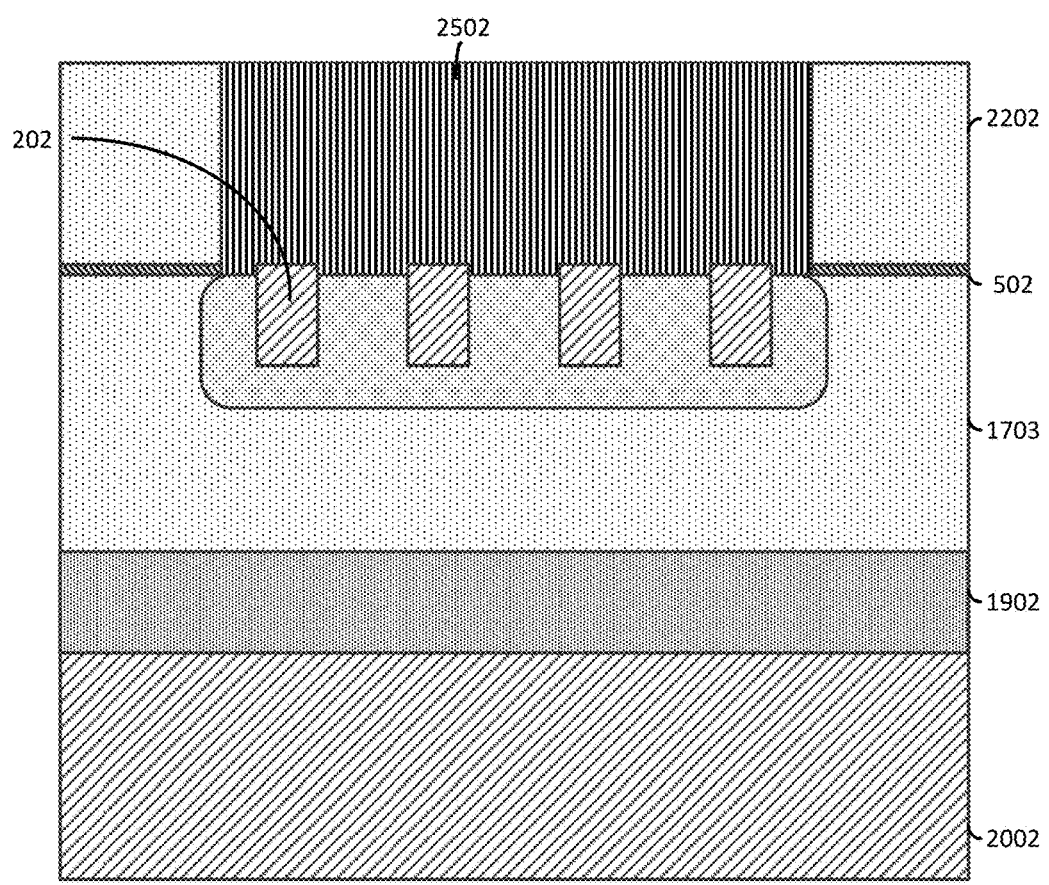

FIGS. 24-25 illustrate an alternate exemplary method for forming a finFET device that includes forming contacts over the etch stop layer 502.

In this regard, FIG. 24 illustrates a side view of a structure similar to the structure shown in FIG. 22 that was fabricated using a similar method as described above in FIGS. 1-22 following the removal of portions of the insulator layer 2202 and the etch stop layer 502 to form a cavity 2402 that exposes portions of the source/drain region 1602 and the fins 202.

FIG. 25 illustrates a side view following the formation of contacts 2502 in the cavity 2402. The contacts 2502 may include, for example, a conductive metal, and in some embodiments a liner layer (not shown) deposited prior to depositing the conductive metal.

FIGS. 26-32 illustrate an alternate exemplary method for forming a finFET device that includes forming contacts over the source/drain regions 1602.

Figure 26:
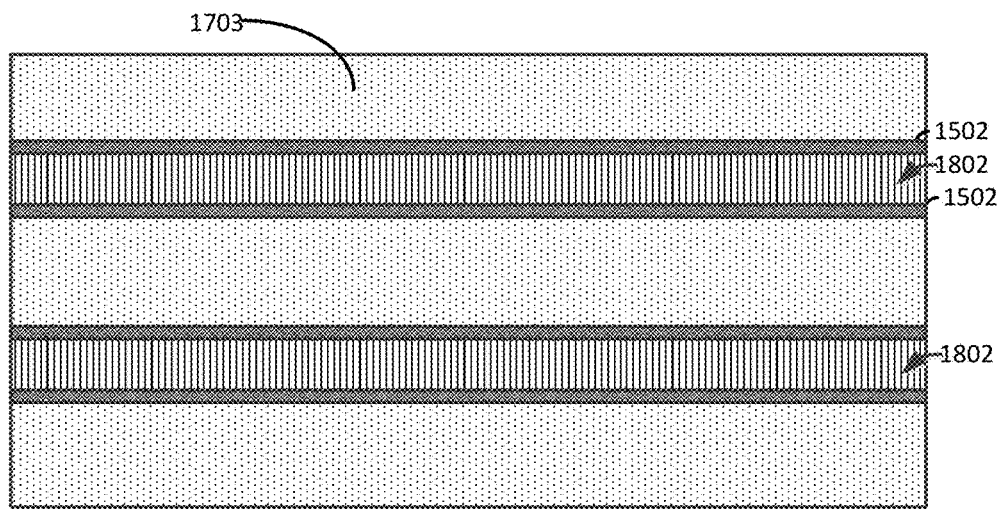
FIGS. 26-32 illustrate an alternate exemplary method for forming a finFET device that includes forming contacts over the source/drain regions.

In this regard, FIG. 26 illustrates a top view of a structure that is similar to the structure shown in FIG. 18A however, the source/drain region 1602 are not formed. The structure in FIG. 26 may be fabricated using similar methods as described above in FIGS. 1-18B.

Figure 27:
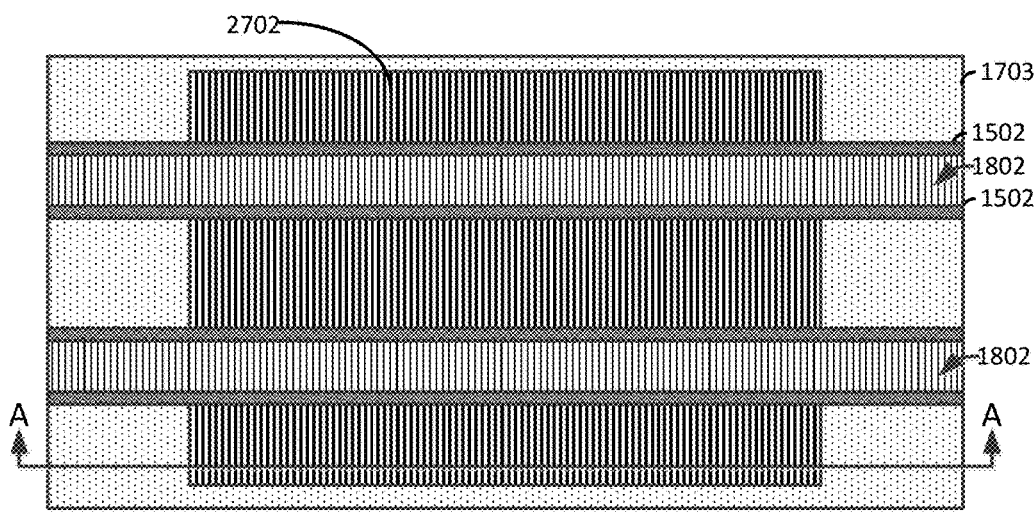

FIG. 27 illustrates a top view following a patterning and etching process that removes exposed portions of the inter-level dielectric layer 1703 and exposes portions of the fins 202 (of FIG. 2) and the etch stop layer 502 (of FIG. 5). Following the exposure of the fins 202, conductive contacts 2702 are formed by, for example, depositing a conductive material and optionally, a liner layer prior to depositing the conductive material in a similar manner as described above for forming conductive contacts.

Figure 28:
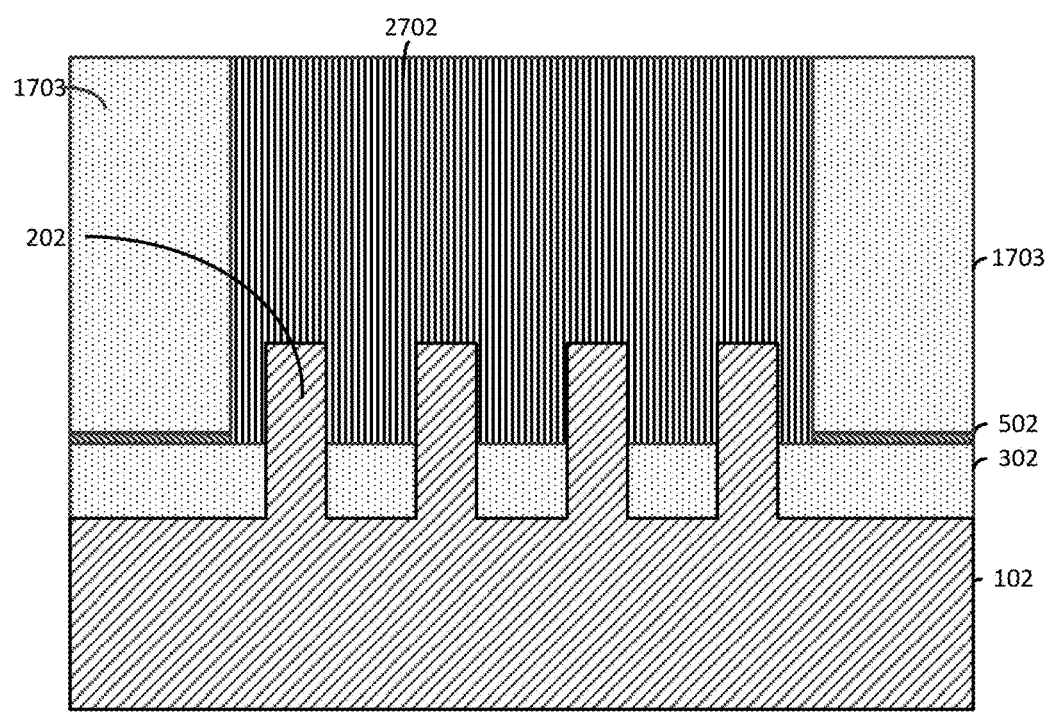

FIG. 28 illustrates a cut-away view along the line A-A (of FIG. 27) that shows the conductive contacts 2702 arranged over the fins 202. Though the illustrated embodiment shows the removal of exposed portions of the etch stop layer 502 adjacent to the fins 202, in some alternate exemplary embodiments, the etch stop layer 502 may remain over the STI region 302 adjacent to fins 202. In yet another alternate exemplary embodiment, a portion or all of the exposed STI region 302 may be removed adjacent to the fins 202 such that the conductive contacts 2702 contact the fins 202 and portions of the STI region 302 and in some embodiments, the substrate 102 below the fins 202.

Figure 29:
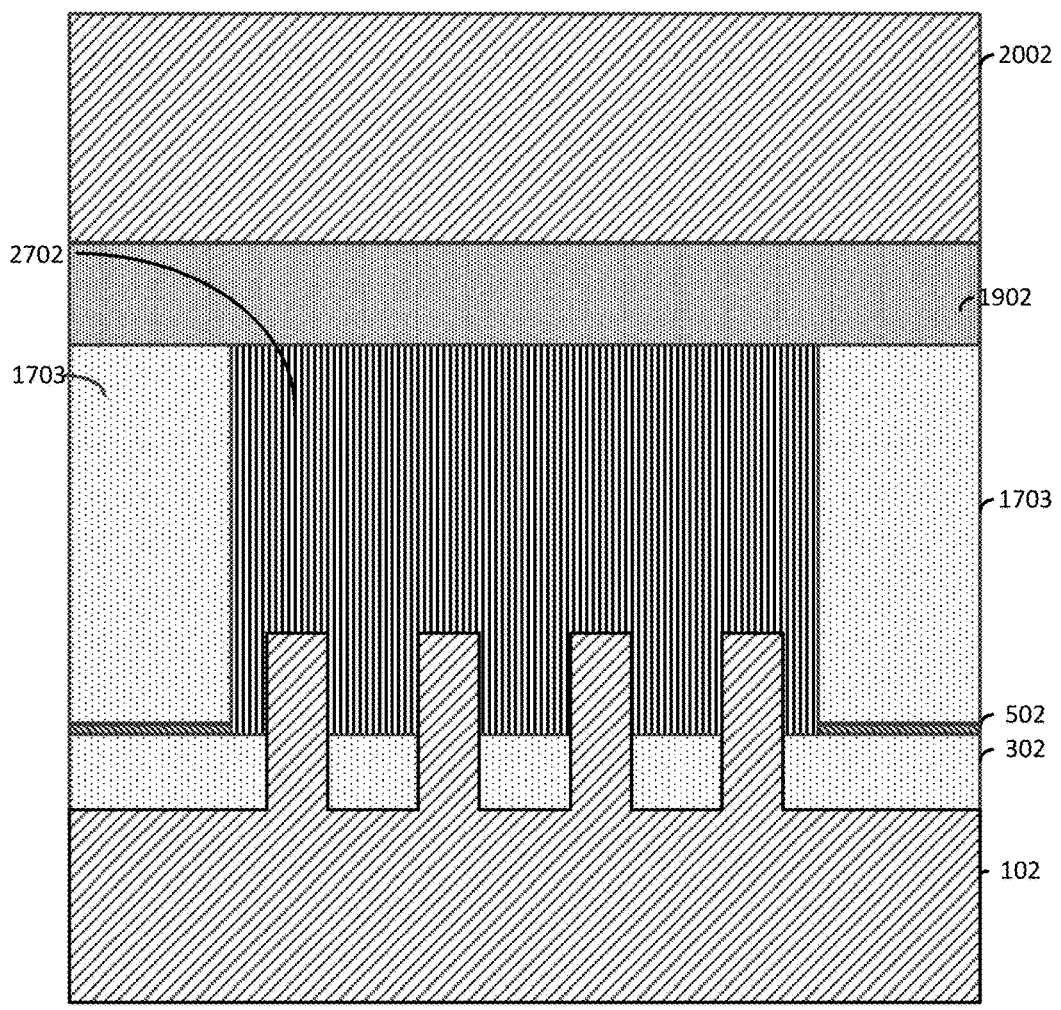

FIG. 29 illustrates a side view following the formation of a bonding film 1902 and the bonding of the handle wafer 2002 to the bonding film 1902 in a similar manner as described above.

Figure 30:
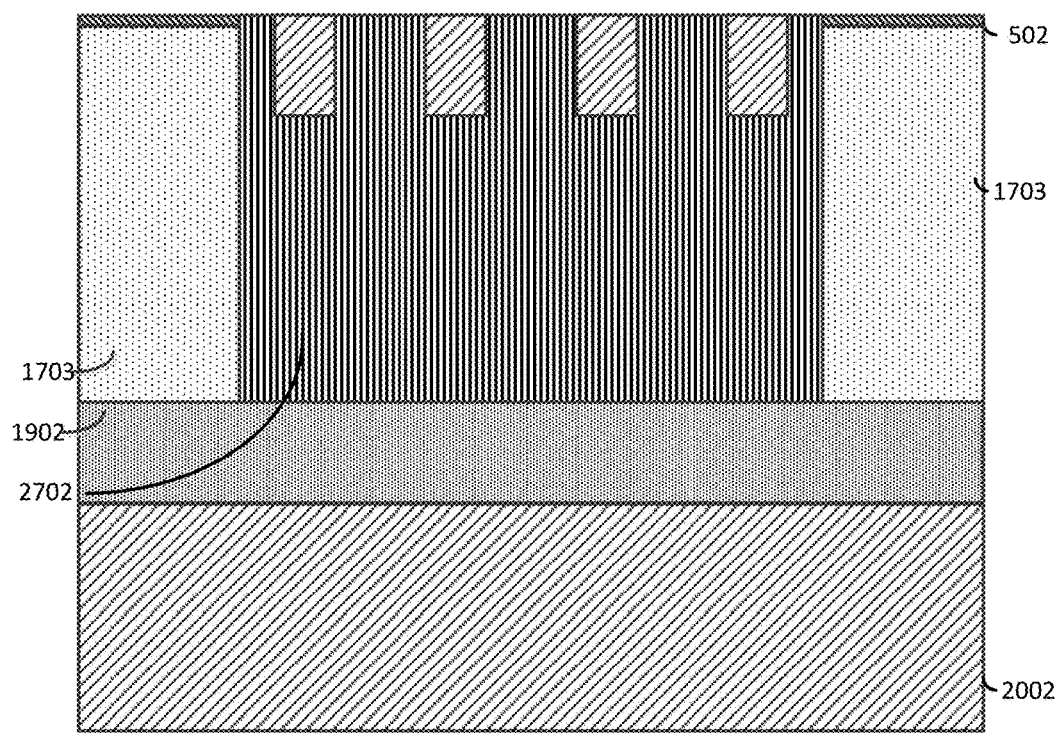

FIG. 30 illustrates a side view following a grinding and planarization process that exposes portions of the fins 202 and the etch stop layer 502 using a similar process as described above in FIG. 21.

Figure 31:
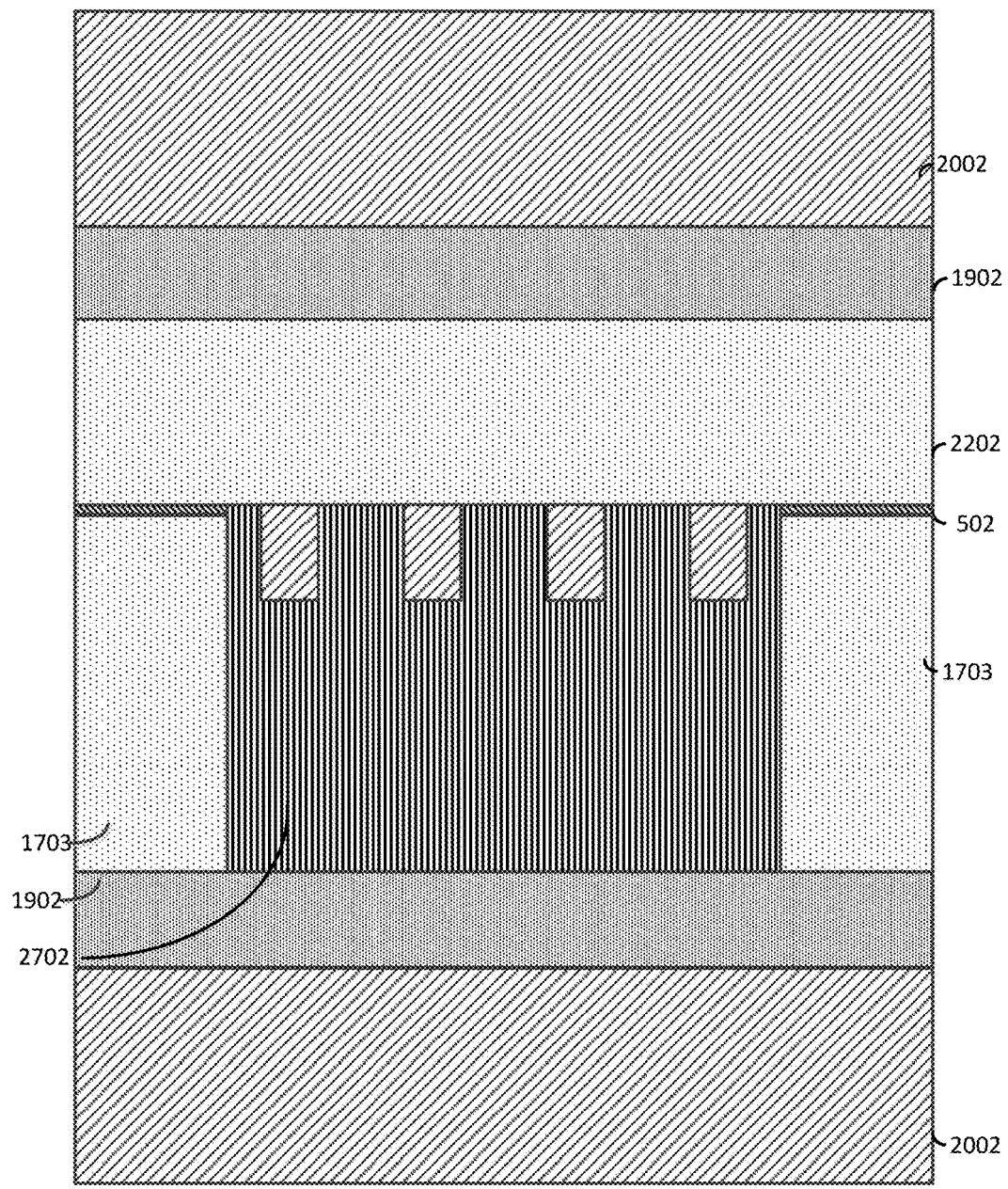

FIG. 31 illustrates a side view following the formation of an insulator layer 2202 using a similar process as described above in FIG. 22. In the illustrated embodiment, a second bonding layer 1902 has been deposited on the insulating layer 2202 using a similar deposition process as described above. A second handle wafer 2002 has been bonded to the second bonding layer 1902.

Figure 32:
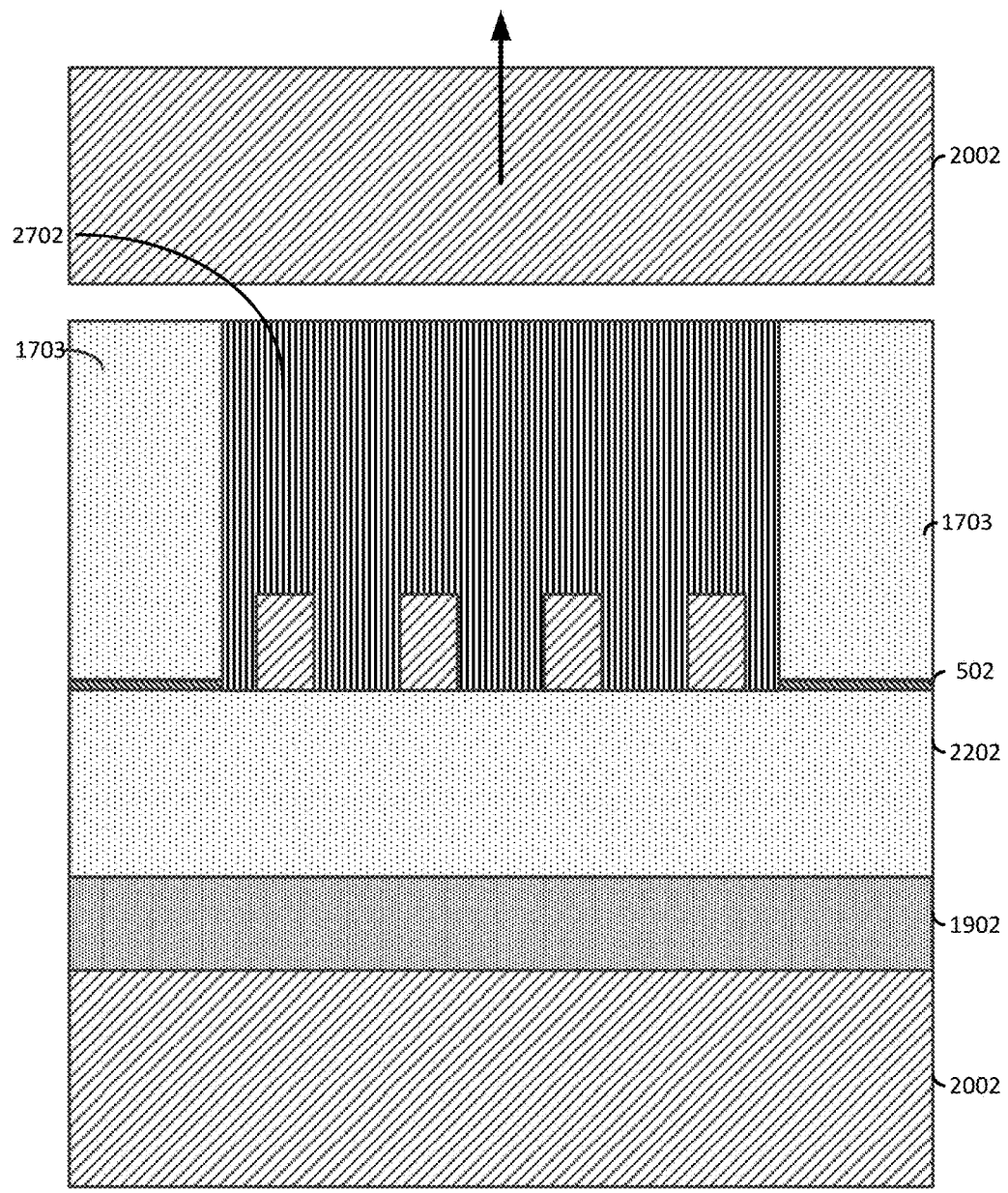

FIG. 32 illustrates a side view of the resultant structure following the removal of the handle wafer 2002 and the bonding film 1902 (of FIG. 31). The resultant structure includes a finFET device arranged on an insulator layer 2202 and an etch stop layer 502 with a contact arranged on the source/drain regions 1602 of the device.

Figure 33:
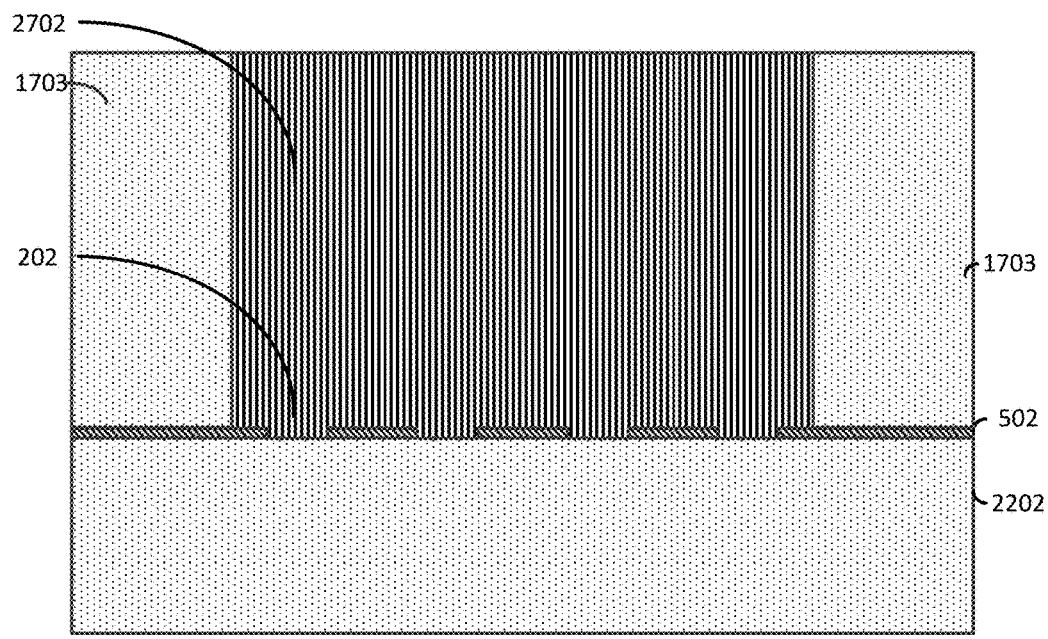
FIG. 33 illustrates a side view of an alternate exemplary embodiment that is similar to the structure shown in FIG. 32.

FIG. 33 illustrates a side view of an alternate exemplary embodiment that is similar to the structure shown in FIG. 32. However, the contacts 2702 are formed following the removal of the fins 202 prior to the deposition of the contact 2702 material.

Figure 34:
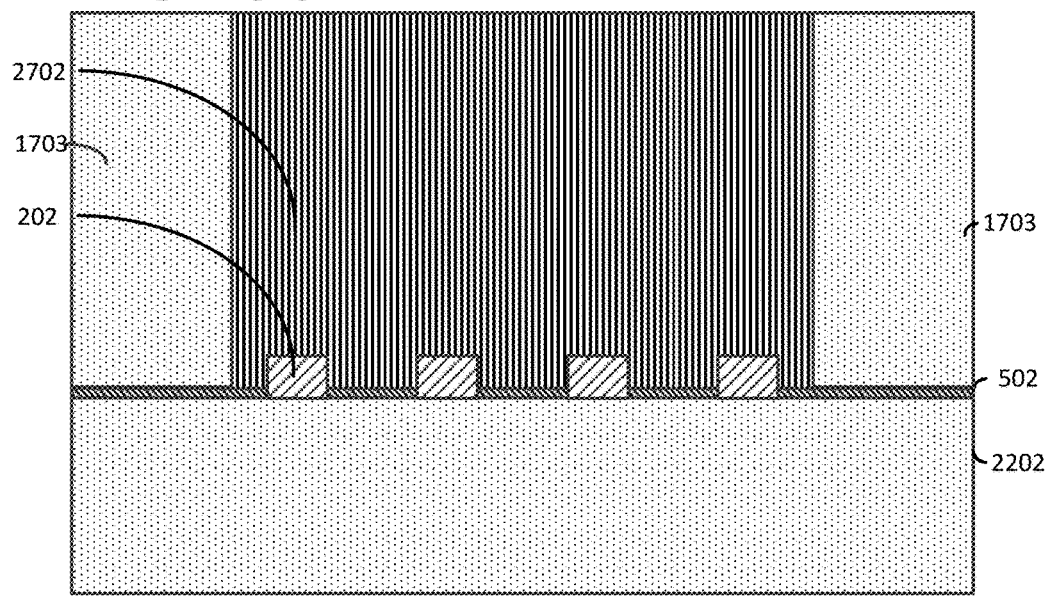
FIG. 34 illustrates a side view of yet another alternate exemplary embodiment that is similar to the structure shown in FIG. 32.

FIG. 34 illustrates a side view of yet another alternate exemplary embodiment that is similar to the structure shown in FIG. 32. However, in the illustrated exemplary embodiment, the portions of the fins 202 have been removed using a suitable etching process prior to the formation of the conductive contacts 2702.

Figure 35:
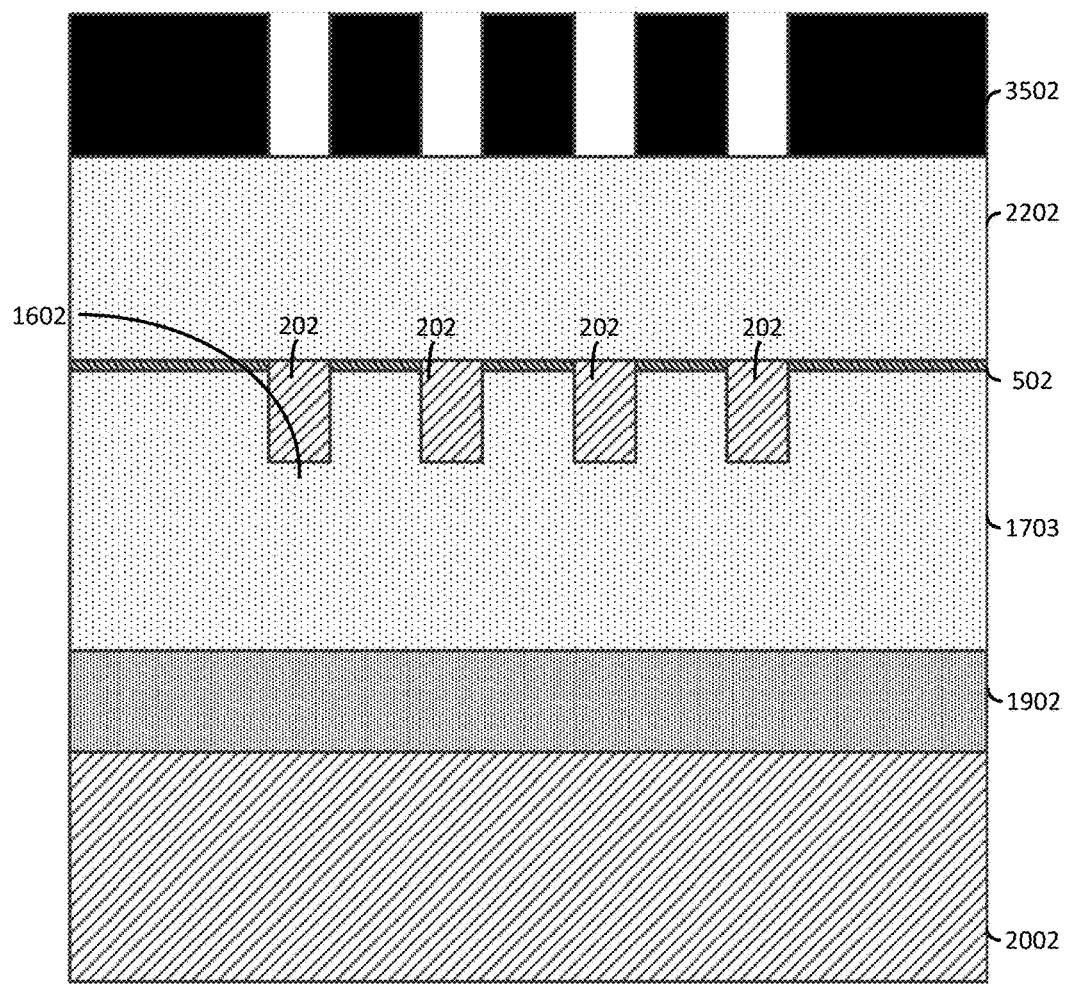
FIGS. 35-40 illustrate an alternate exemplary method for forming contacts for a finFET device.

FIGS. 35-40 illustrate an alternate exemplary method for forming contacts for a finFET device. FIG. 35 illustrates a finFET arrangement similar to the device shown in FIG. 22. However, in the illustrated exemplary embodiment of FIG. 35, the source/drain regions 1602 (of FIG. 22) have been omitted.

Figure 36:
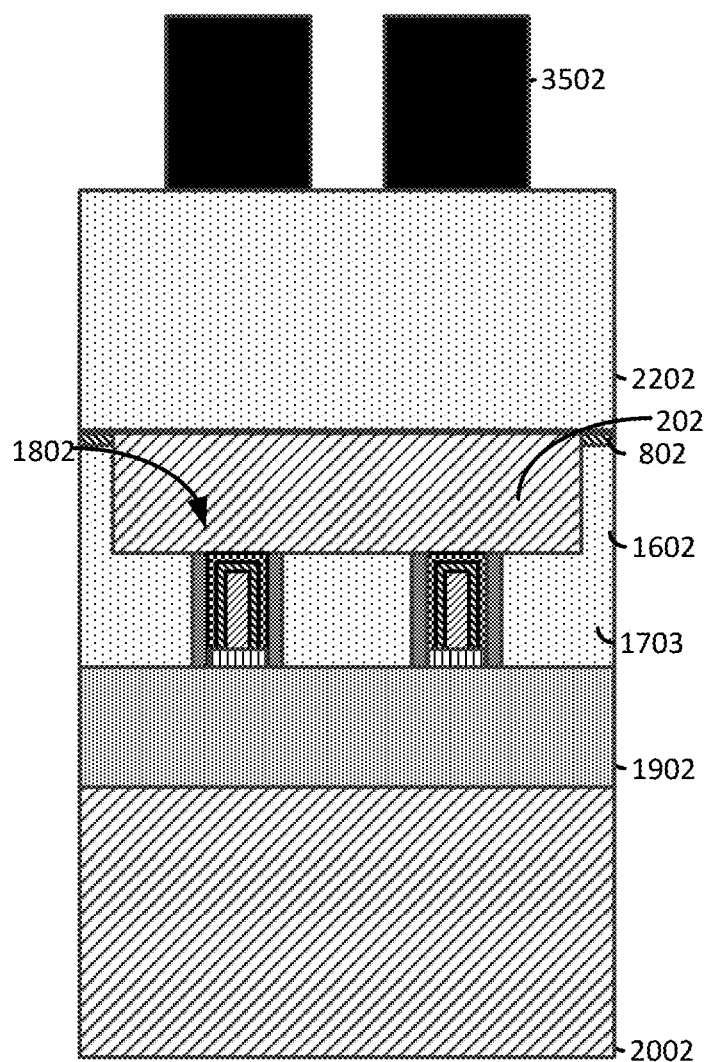

FIG. 35 illustrates a cut-away view through the source/drain region 1602 parallel to the gate stack 1802 (shown in FIG. 36). A mask 3502 has been patterned over the insulator layer 2202 using a photolithographic process. FIG. 36 illustrates a cut-away view through a fin 2202 a perpendicular to the gate stacks 1802.

Figure 37:
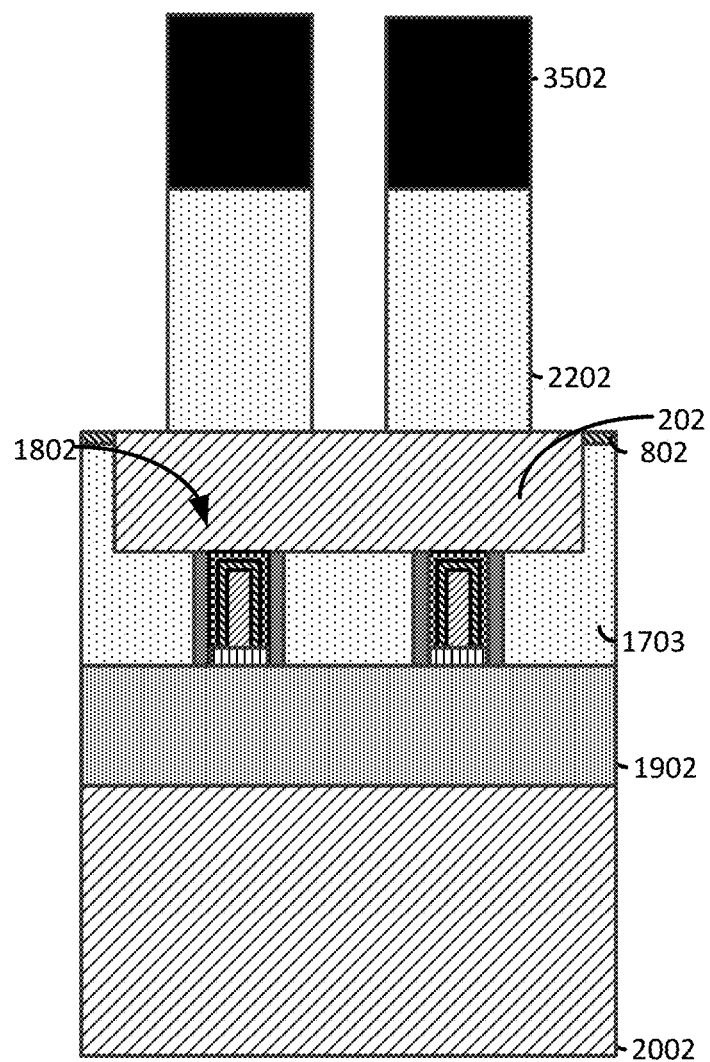

FIG. 37 illustrates a cut-away view following the removal of exposed portions of the insulator layer 2202 to expose portions of the underlying fins 202. The insulator layer 2202 may be removed by a suitable etching process such as, for example, reactive ion etching.

Figure 38:
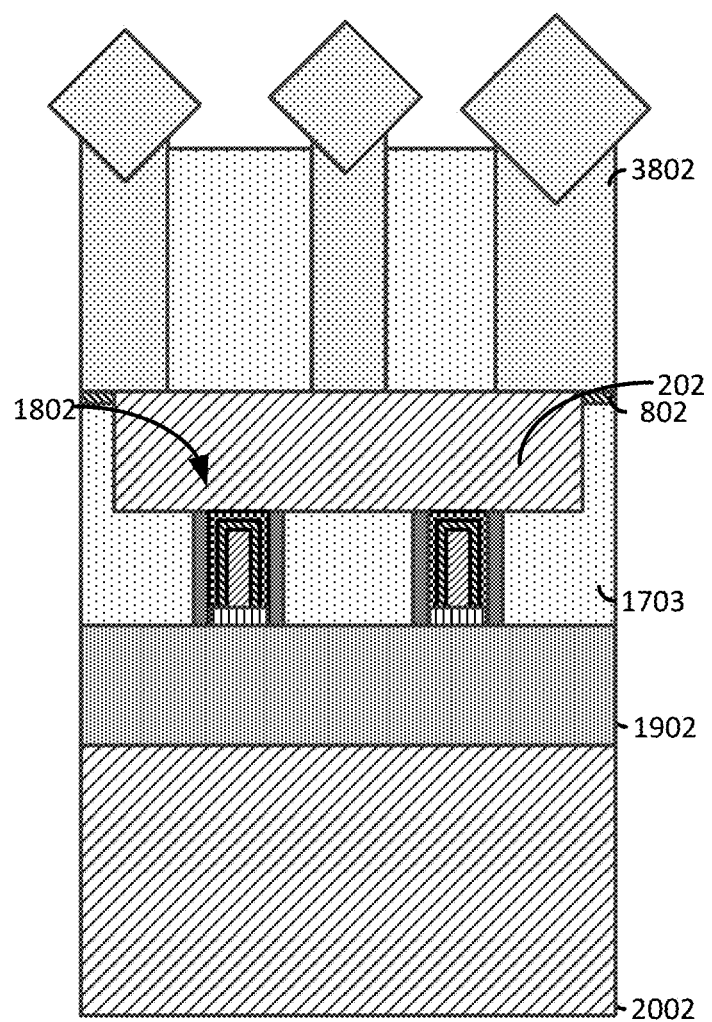

FIG. 38 illustrates a cut-away view following the removal of the mask 3502 (of FIG. 37) and an epitaxial growth process that forms extended source/drain regions 3802 that are seeded by the exposed portions of the fins 202. The source/drain regions 3802 are formed using a similar process as used to form the source/drain regions 1602 described above.

Figure 39:
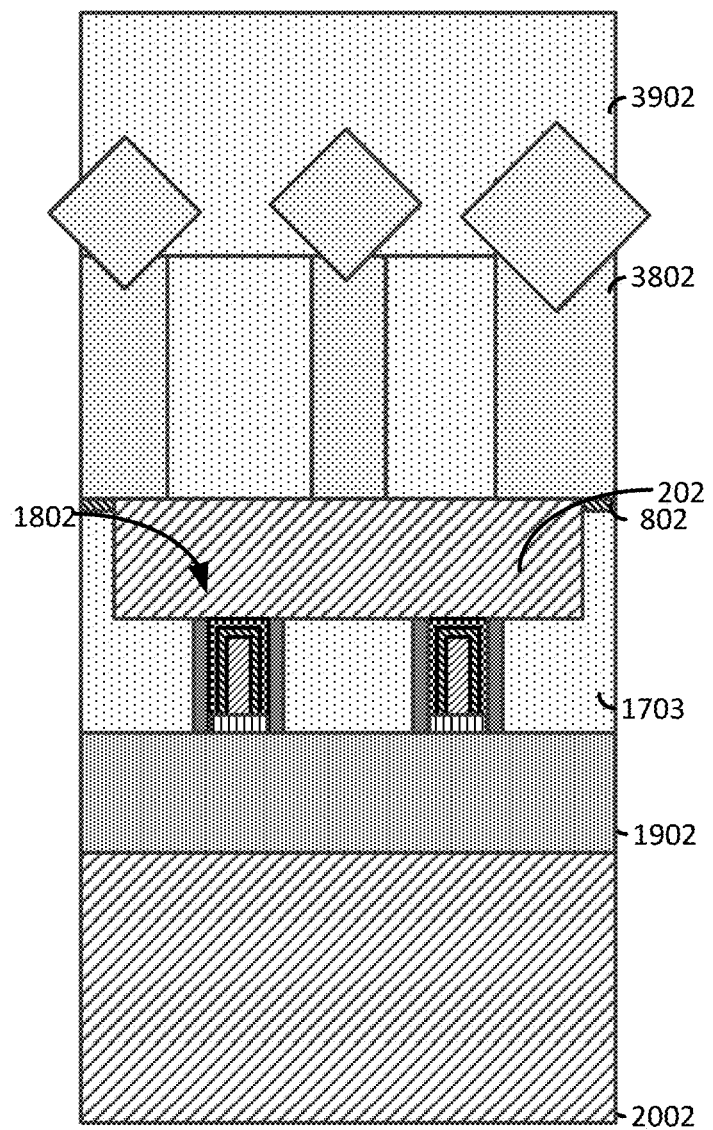

FIG. 39 illustrates a cut-away view following the formation of an insulator layer 3902 over the source/drain regions 3802 using a similar deposition process as described above to form other insulator layers.

Figure 40:
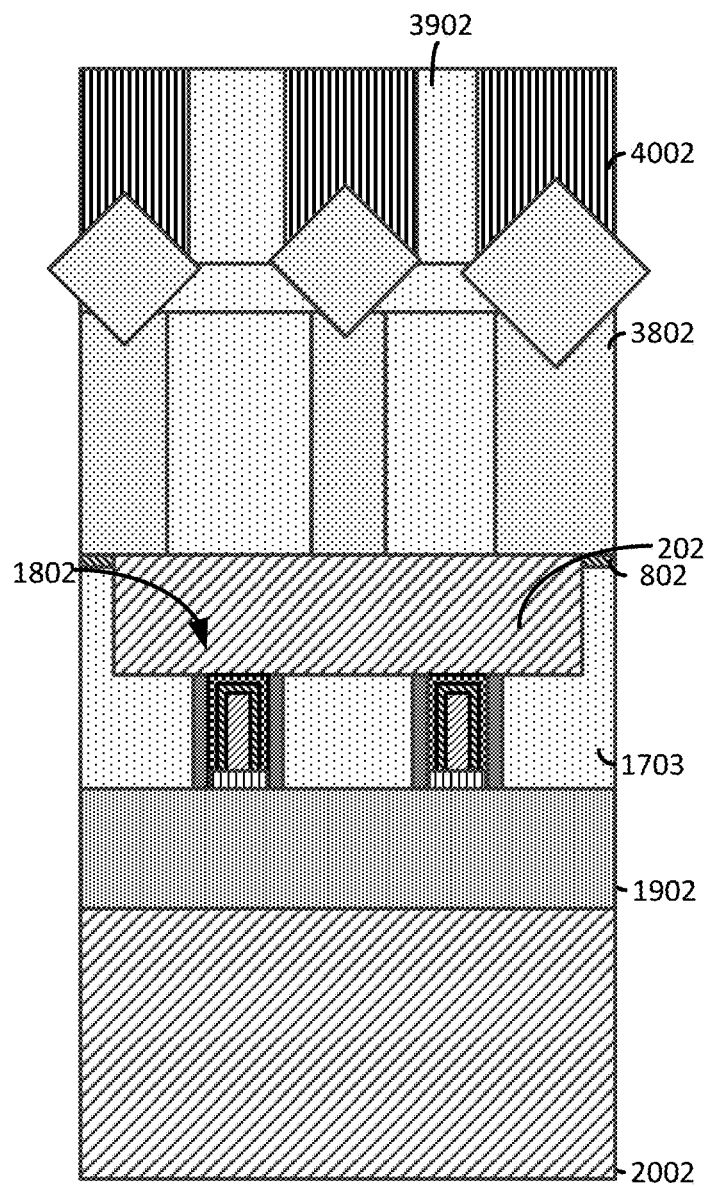

FIG. 40 illustrates a cut-away view following a lithographic patterning and etching process that removes portions of the insulator layer 3902 and exposes the source/drain regions 3802. Following the exposure of the source/drain regions 3802, conductive contacts 4002 are formed in the cavities (not shown). The conductive contacts 4002 may include, in some exemplary embodiments, a liner layer (not shown) that is deposited prior to depositing the conductive material to form the conductive contacts 4002.

Figure 41:
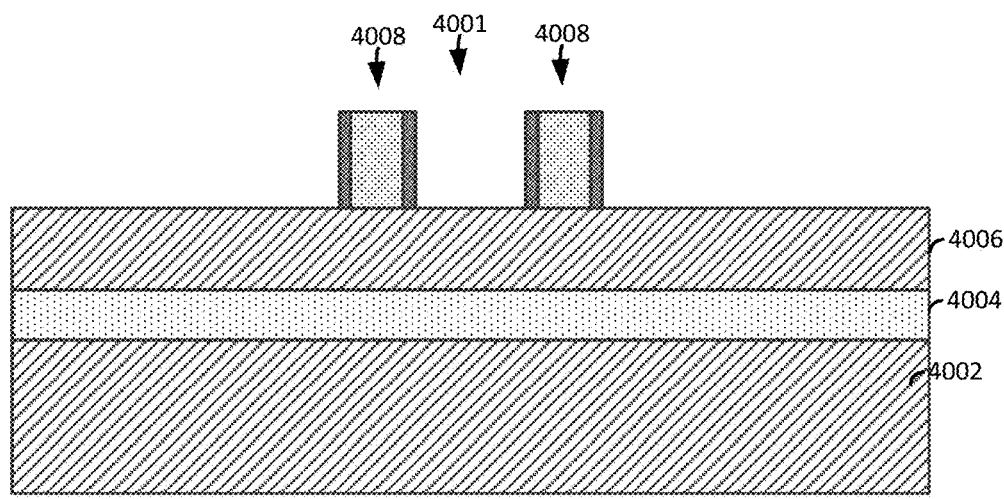
FIGS. 41-43 illustrate another alternate exemplary method for forming contacts for a finFET device on a semiconductor-on-insulator wafer.
Figure 42:
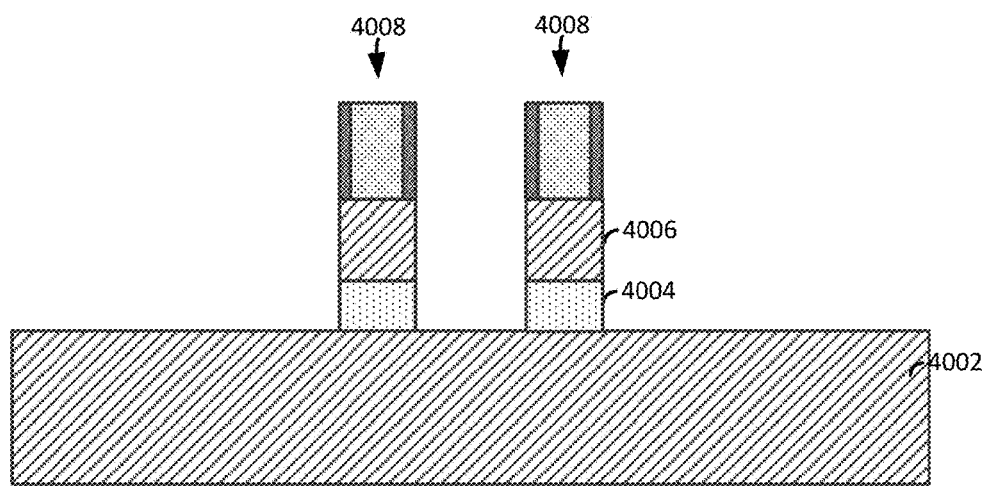
Figure 43:
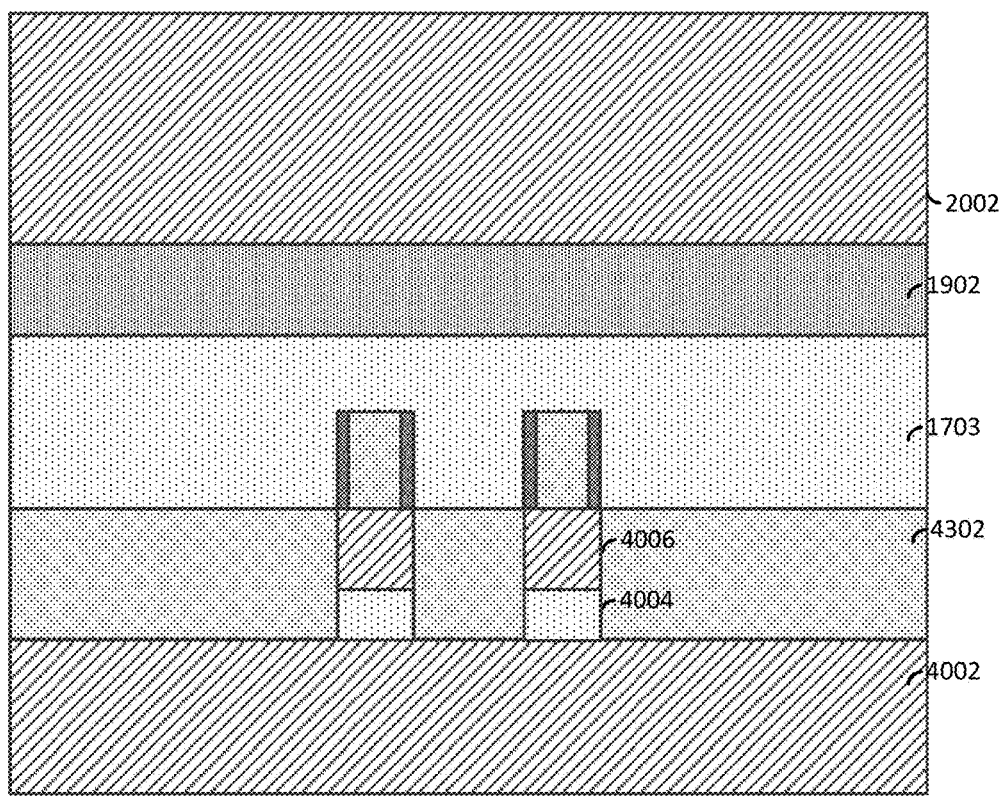

FIGS. 41-43 illustrate another alternate exemplary method for forming contacts for a finFET device on a semiconductor-on-insulator (SOI) wafer.

FIG. 41 illustrates a cutaway view of a finFET device 4001 arranged on an SOI wafer 4002. The SOI wafer 4002 includes an insulator layer 4004 and a semiconductor substrate that has been patterned to form a fin 4006 arranged on the insulator layer 4004. Gate stacks 4008 are arranged on the fin 4006. The SOI wafer 4002 can be formed by any suitable technique such as, for example wafer bonding, Smartcut™, SIMOX (Separation by IMplanted Oxygen).

FIG. 42 illustrates a cut-away view following a selective etching process that removes portions of the insulator layer 4004 and portions of the fin 4006 to expose the underlying substrate 4002. In some exemplary embodiments, the fin 406 may remain while exposed regions of the adjacent insulator layer 4004 are selectively etched.

FIG. 43 illustrates a cut-away view following an epitaxial growth process that forms a source/drain region 4302. The source/drain region 4302 is seeded from exposed portions of the fins 4006 and/or the substrate 4002. Following the formation of the source/drain region 4302, an inter-level dielectric layer 1703 is formed over the source/drain region 4302. A bonding film 1902 is formed over the inter-level dielectric layer 1703 and a handle wafer 2002 is bonded to the bonding film 1902.

Figure 44:
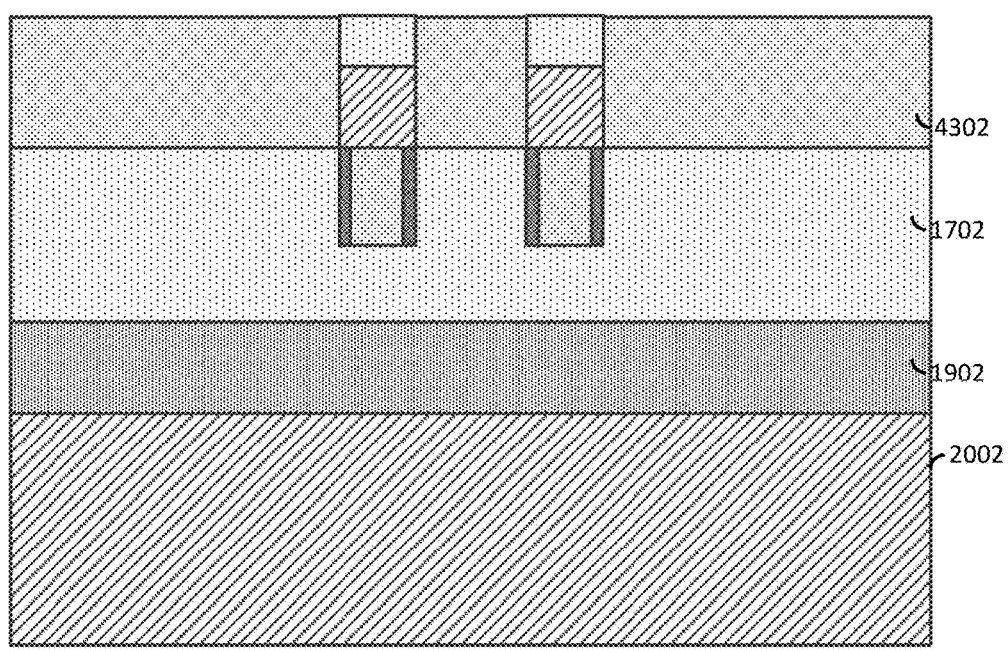
FIG. 44 illustrates the resulting structure following the rotation of the device and a planarization or etching process that removes the substrate 4002 and exposes the source/drain region 4302.

FIG. 44 illustrates the resulting structure following the rotation of the device and a planarization or etching process that removes the substrate 4002 and exposes the source/drain region 4302.

Figure 45:
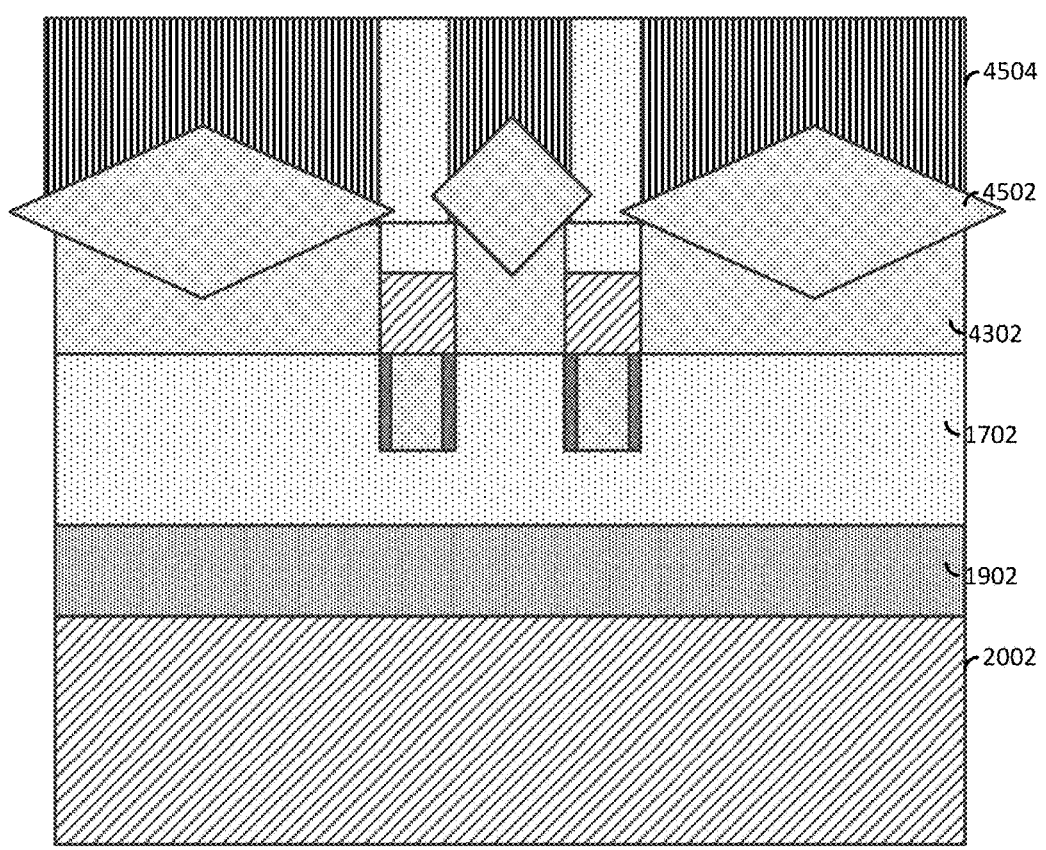
FIG. 45 illustrates a cut-away view of the resultant structure following another epitaxial growth process that forms a back-side source/drain region 4502 that is seeded from the source/drain region 4302.

FIG. 45 illustrates a cut-away view of the resultant structure following another epitaxial growth process that forms a back-side source/drain region 4502 that is seeded from the source/drain region 4302. Following the formation of the back-side source/drain region 4502, conductive contacts 4504 may be formed using a similar process as discussed above in FIG. 40.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
    forming a fin in a bulk semiconductor substrate;
    depositing a first insulator layer over portions of the bulk semiconductor substrate adjacent to the fin;
    removing portions of the first insulator layer to reduce a thickness of the first insulator layer and expose a sidewall of the fin;
    depositing an etch stop layer on the first insulator layer;
    forming a gate stack over a channel region of the fin and over portions of a first surface of the etch stop layer;
    removing a portion of the bulk semiconductor substrate to expose portions of a second surface of the etch stop layer and the fin; and
    depositing a second insulator layer over exposed portions of the fin and the second surface of the etch stop layer.

2. The method of claim 1, further comprising:
    depositing a bonding film on the etch stop layer and the gate stack after forming the gate stack;
    bonding a handle wafer to the bonding film; and
    removing the handle wafer from the bonding film following the depositing the second insulator layer.

3. The method of claim 1, further comprising:
    removing portions of the second insulator layer and the etch stop layer to expose a source/drain region; and
    depositing a contact material on the source/drain region.

4. The method of claim 1, wherein the first insulator layer includes an oxide material.

5. The method of claim 1, wherein the etch stop layer includes a nitride material.

6. The method of claim 2, further comprising depositing a third insulator layer over portions of the fin prior to depositing the bonding film.

7. The method of claim 1, wherein the removing portions of the bulk semiconductor substrate to expose portions of the etch stop layer and the fin includes performing a planarizing process.

8. The method of claim 2, further comprising forming a source/drain region on the fin prior to depositing the bonding film on the etch stop layer and the gate stack.

9. The method of claim 8, further comprising prior to depositing the bonding film, forming conductive contacts on the source/drain region.

10. A method for forming a semiconductor device, the method comprising:
    depositing a first insulator layer on a bulk semiconductor substrate;
    depositing an etch stop layer on the first insulator layer;
    depositing a second insulator layer on the etch stop layer;
    removing a portion of the second insulator layer, the etch stop layer, and the first insulator layer to form a cavity that exposes a portion of the bulk semiconductor substrate;
    growing a semiconductor fin in the cavity;
    removing the second insulator layer to expose the etch stop layer and sidewalls of the fin;
    forming a gate stack over a channel region of the fin and over portions of a first surface of the etch stop layer;
    removing portions of the bulk semiconductor substrate to expose portions of a second surface of the etch stop layer and to expose portions of the fin, said second surface opposite the first surface of the etch stop layer; and
    depositing a third insulator layer over exposed portions of the fin and the second surface of the etch stop layer.

11. The method of claim 10, further comprising:
    depositing a bonding film on the etch stop layer and the gate stack after forming the gate stack;
    bonding a handle wafer to the bonding film; and
    removing the handle wafer from the bonding film following the depositing the third insulator layer.

12. The method of claim 10, further comprising:
    removing portions of the third insulator layer and the etch stop layer to expose a source/drain region; and
    depositing a contact material on the source/drain region.

13. The method of claim 10, wherein the first insulator layer includes an oxide material.

14. The method of claim 10, wherein the etch stop layer includes a nitride material.

15. The method of claim 11, further comprising depositing a third insulator layer over portions of the fin prior to depositing the bonding film.

16. The method of claim 10, wherein the removing portions of the bulk semiconductor substrate to expose portions of the etch stop layer and the fin includes performing a planarizing process.

17. The method of claim 11, further comprising fainting a source/drain region on the fin prior to depositing the bonding film on the etch stop layer and the gate stack.

18. The method of claim 11, further comprising prior to depositing the bonding film, forming conductive contacts on the source/drain region.

* * * * *